United States Patent
Tsuchiaki

(10) Patent No.: US 7,701,017 B2
(45) Date of Patent: Apr. 20, 2010

(54) MOS SEMICONDUCTOR DEVICE AND METHOD OF FABRICATING THE SAME

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 11/674,356

(22) Filed: Feb. 13, 2007

(65) Prior Publication Data
US 2007/0246781 A1  Oct. 25, 2007

(30) Foreign Application Priority Data
Apr. 25, 2006  (JP) .............................. 2006-121008

(51) Int. Cl.
*H01L 29/78* (2006.01)
(52) U.S. Cl. ................. 257/384; 257/369; 438/198; 438/199
(58) Field of Classification Search .......... 257/E21.135, 257/E29.28, 255, 369, 384; 438/659, 198, 438/199
See application file for complete search history.

(56) References Cited

U.S. PATENT DOCUMENTS

| | | | |
|---|---|---|---|
| 5,885,861 A * | 3/1999 | Gardner et al. .............. | 438/231 |
| 6,100,191 A * | 8/2000 | Lin et al. .................... | 438/661 |
| 6,271,566 B1 | 8/2001 | Tsuchiaki | |
| 6,838,363 B2 * | 1/2005 | Wieczorek et al. .......... | 438/528 |
| 2002/0058402 A1 * | 5/2002 | Wieczorek et al. .......... | 438/586 |
| 2005/0142774 A1 * | 6/2005 | Lee et al. .................... | 438/296 |
| 2005/0280097 A1 * | 12/2005 | Anderson et al. ........... | 257/371 |

FOREIGN PATENT DOCUMENTS

| | | |
|---|---|---|
| JP | 05-094928 | 4/1993 |
| JP | 11-111980 | 4/1999 |
| JP | 2004-288798 | 10/2004 |
| JP | 2005-259956 | 9/2005 |
| JP | 2005-260264 | 9/2005 |
| JP | 2007-294496 | 11/2007 |

OTHER PUBLICATIONS

Masakatsu Tsuchiaki, et al., "Suppression of Thermally Induced Leakage of NiSi-Silicided Shallow Junctions by Pre-Silicide Fluorine Implantation", Japanese Journal of Applied Physics, vol. 44, No. 4A, 2005, pp. 1673-1681.

H. Irie, et al., "In-Plane Mobility Anisotrophy and Universality Under Uni-axial Strains in n- and p-MOS Inversion Layers on (100), (110), and (111) Si", IEDM Tech. Dig., 2004, 4 pages.

Chun-Yung Sung, et al., "High Performance CMOS Bulk Technology Using Direct Silicon Bond (DSB) Mixed Crystal Orientation Substrates", IEDM Tech. Dig., 2005, 4 pages.

* cited by examiner

*Primary Examiner*—Thao X Le
*Assistant Examiner*—Tanika Warrior
(74) *Attorney, Agent, or Firm*—Oblon, Spivak, McClelland, Maier & Neustadt, L.L.P.

(57) ABSTRACT

A MOS semiconductor device includes a substrate having a first region with a Si(110) surface and a second region with a Si(100) surface, a p-channel MOSFET formed in the first region, and an n-channel MOSFET formed in the second region. The p-channel MOSFET including a first silicide layer formed on source/drain regions, and containing N atoms at an areal density of $8.5 \times 10^{13}$ to $8.5 \times 10^{14}$ cm$^{-2}$, and F atoms at an areal density of less than $5.0 \times 10^{12}$ cm$^{-2}$. The n-channel MOSFET including a second silicide layer formed on a source/drain regions, and containing F atoms at an areal density of not less than $5.0 \times 10^{13}$ cm$^{-2}$.

11 Claims, 9 Drawing Sheets

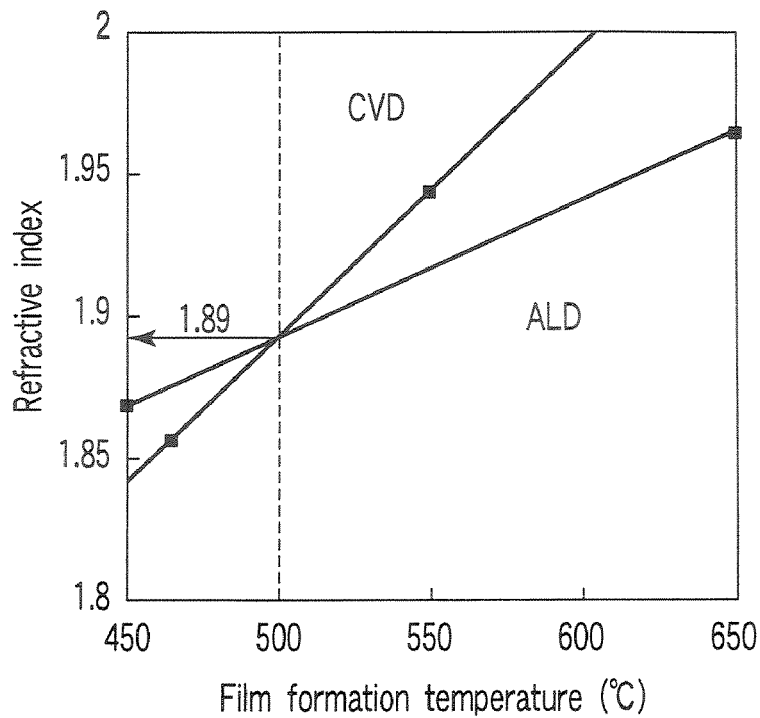
F I G. 10
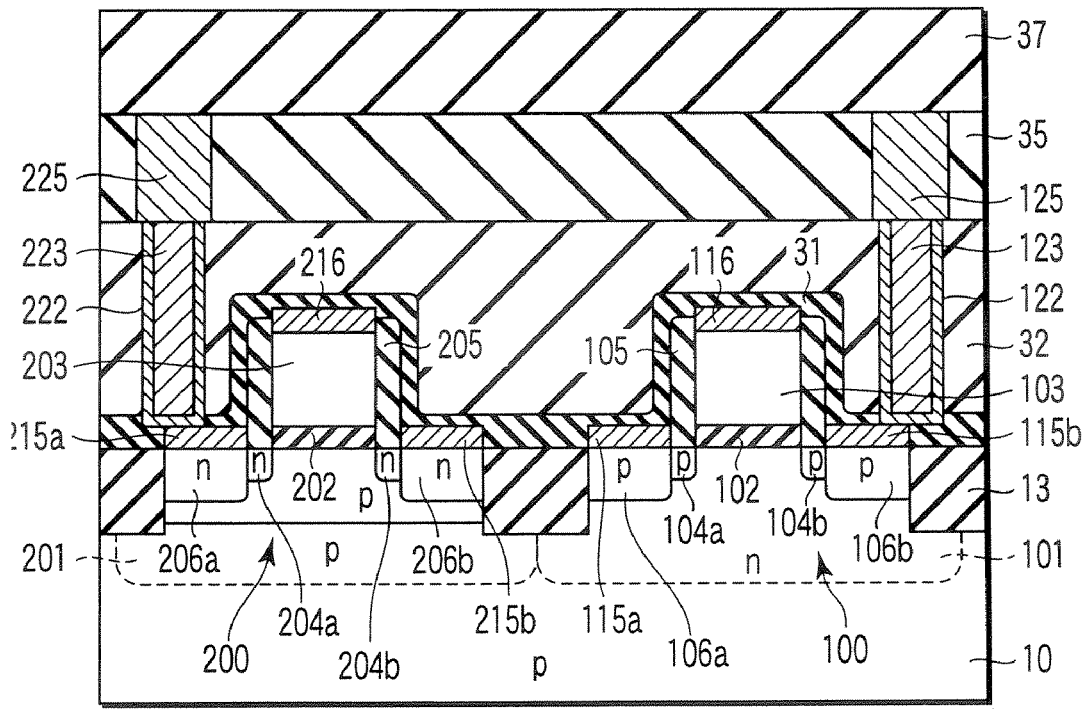
F I G. 11

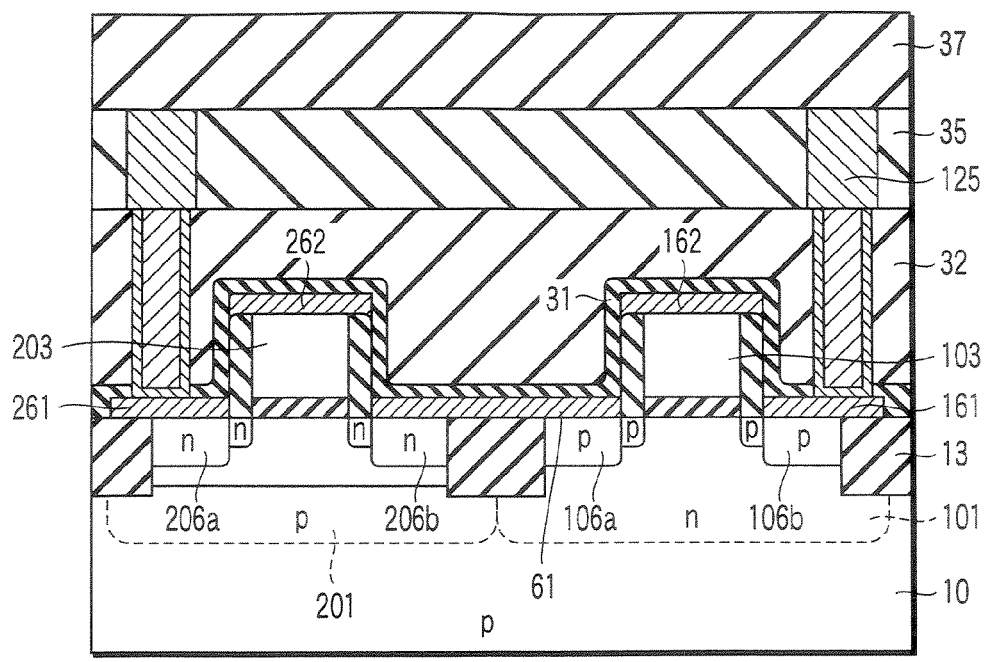
F I G. 13
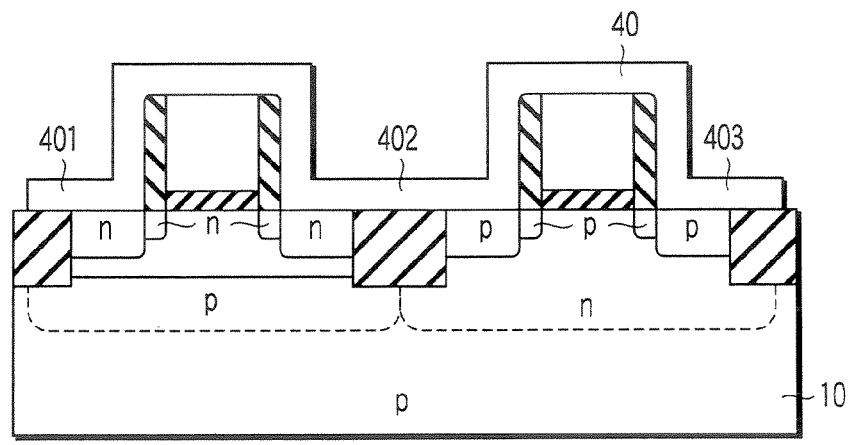
F I G. 14A
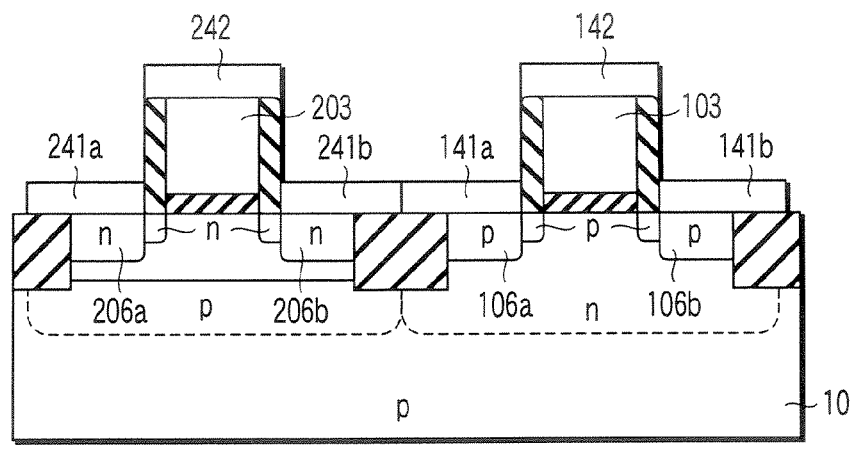
F I G. 14B

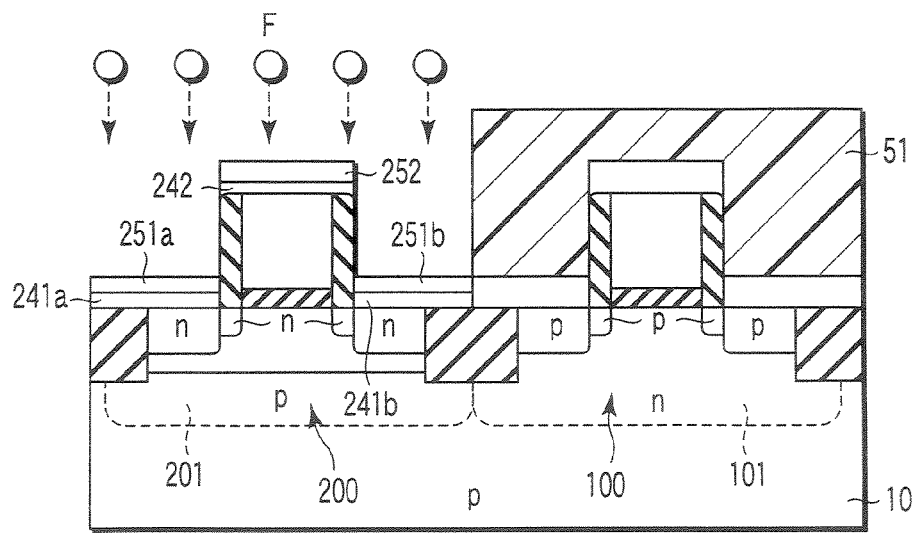
F I G. 14C
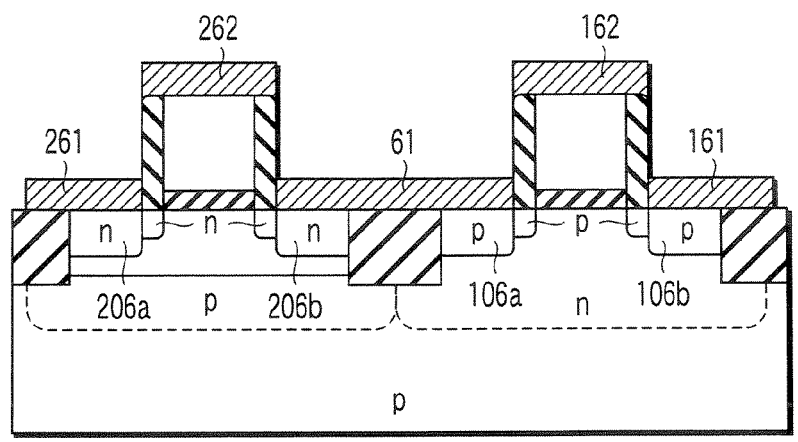
F I G. 14D
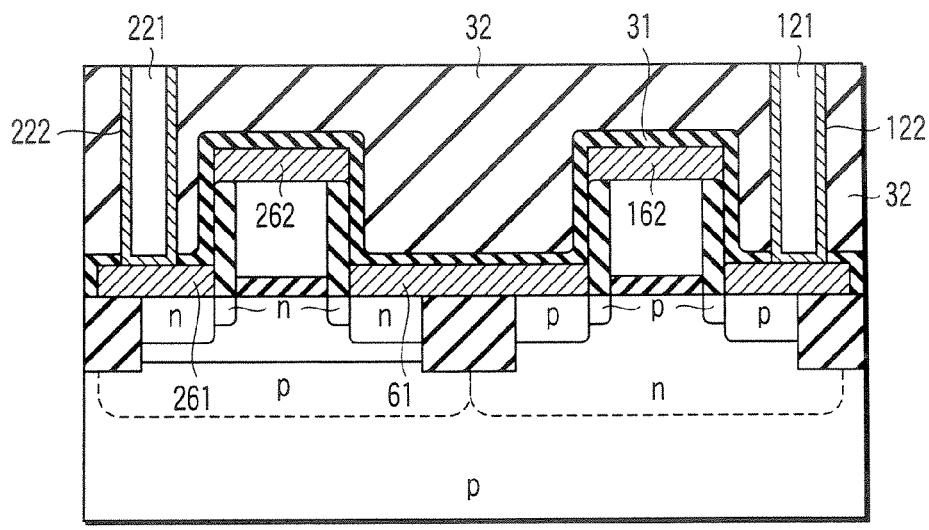
F I G. 14E

MOS SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2006-121008, filed Apr. 25, 2006, the entire contents of which are incorporated herein by reference.

BACKGROUND OF THE INVENTION

1. Field of the Invention

The present invention relates to a MOS semiconductor device having a p-channel MOSFET (p-MOSFET) and n-channel MOSFET (n-MOSFET) formed on different crystal planes, and a method of fabricating the same.

2. Description of the Related Art

To increase the operating speed of a complementary MOS-FET (C-MOSFET) having both a p-MOSFET and n-MOSFET formed on a single-crystal Si substrate, the mobilities of carriers flowing through channel portions must be kept high. However, the crystal plane on which the highest carrier (i.e., hole) mobility can be achieved for the p-MOSFET is different from the crystal plane on which the highest carrier (i.e., electron) mobility can be obtained for the n-MOSFET. That is, for a Si substrate, a surface crystal plane which achieves the maximum electron mobility is (100), whereas a surface crystal plane which achieves the maximum hole mobility is (110) (H. Irie et al., IEDM Tech. Dig. pp. 225-228, 2004). Thus, simultaneous optimization of the operation speeds of both types of the MOSFETs is unattainable if one uses the single-crystal Si substrate (which has a unique and definite surface crystal orientation). Accordingly, the high-speed operation of the entire C-MOSFET function must be significantly compromised on the conventional single-crystal Si substrate, no matter which crystal plane the substrate surface is oriented to.

Recently, therefore, to increase the operating speed of MOSFETs of the both polarities in a C-MOSFET circuit, a method called Direct Substrate Bonding (DSB) is proposed, where a thin crystalline Si layer having different crystal orientation from a host crystal Si substrate is directly bonded to the substrate surface (C. Sung et al., IEDM Tech. Dig. pp. 235-238, 2005). Subsequent selective amorphization of specific regions and consequent re-crystallization of the amorphized regions converts the surface orientation of the intended regions to the one identical to the host Si substrate (i.e., the surface orientation different from that of the thin surface crystalline Si layer). In this way, by forming both (100) and (110) surface planes on a complex Si substrate (DSB substrate), the method maximizes the mobilities of MOSFETs of the two polarities simultaneously.

On the other hand, shrinking dimensions of C-MOSFETs requires commensurate shallowing of the junctions in the source/drain regions. Of course, in order to counter the increase of the electrical resistance of the source/drain regions associated with these ever-shallowing source/drain junctions and also to ensure the high-speed device operation, silicidation (i.e., a compound formation between metallic material and silicon) of source/drain regions is an indispensable option for LSI fabrication.

Unfortunately, however, application of the silicide technique to the DSB substrate comes to encounter difficult problems. Since a thin crystalline Si layer having different crystal orientation from the host Si substrate is directly bonded to the substrate, naturally, substantial amounts of crystal defects associated with the lattice mismatching are formed at the shallow bonding plane just below the substrate surface (i.e., close to the pn junctions of the source/drain region). The presence of the crystal defects greatly promotes diffusion of metal atoms (transient enhanced diffusion). Accordingly, metal atoms released from the silicide layer rapidly diffuse and readily reach the pn junctions of the source/drain regions. Because the metal atoms can form gap states in the Si substrate and constitute efficient generation-recombination (GR) centers, the metallic outburst induced by the crystal defects at the shallow bonding plane generates significant leakage current and eventually impair the proper function of the C-MOSFET devices formed on the DSB substrate.

Even an elevated source/drain structure may not provide much help to alleviate this problem. The thickness of a Si layer to be additionally formed by the selective Si growth technique depends on the surface orientation of the substrates. Thus, on the DSB substrate, the thickness comes to change in accordance with the polarity of the MOSFET. Resulting non-uniform and inhomogeneous Si layer necessitates excessive formation of the additional Si layer to secure minimum thickness of the elevated source/drain Si layer. The excessive formation of the additional Si layer leads to an unduly thick layer almost equal to the height of a gate electrode, which is totally intolerable in terms of an unacceptable increase of the capacitive coupling between source/drain regions and the gate electrode. Of course, thinner Si layer formation in a region adjacent to the gate electrode greatly spoils the original intention of leakage suppression by increasing the thickness of the source/drain electrodes.

As described above, the conventional method which increases the operating speed of a C-MOSFET by using a DSB substrate has the problem that the diffusion of metal atoms released from the silicide layer causes significant junction leakage. In addition, even when an elevated source/drain structure is formed in order to solve this problem, uniform and homogeneous film formation is extremely difficult. Therefore, the effective leakage suppression cannot be achieved without forming an intolerably thick Si layers by the selective Si growth.

BRIEF SUMMARY OF THE INVENTION

According to an aspect of the present invention, there is provided an MOS semiconductor device comprising:

a substrate having a first region and a second region, Si surface of the first region being a {110} plane, and Si surface of the second region being a {100} plane;

a p-channel MOSFET comprising:

a first gate electrode insulatively disposed over the first region;

first source/drain regions formed in the first region with the first gate electrode arranged between the first source/drain regions; and a first silicide layer formed on the first source/drain regions, and containing N atoms at an areal density of $8.5 \times 10^{13}$ to $8.5 \times 10^{14}$ cm$^{-2}$, and F atoms at an areal density of less than $5.0 \times 10^{12}$ cm$^{-2}$; and an n-channel MOSFET comprising:

a second gate electrode insulatively disposed over the second region;

second source/drain regions formed in the second region with the second gate electrode arranged between the second source/drain regions; and a second silicide layer formed on the second source/drain regions, and containing F atoms at an areal density of not less than $5.0\times10^{13}$ cm$^{-2}$.

BRIEF DESCRIPTION OF THE SEVERAL VIEWS OF THE DRAWING

FIG. 10 is a graph showing the relationship between the film formation temperature and optical refractive index of the resulting silicon nitride film, for each of CVD and ALD;

FIG. 11 is a cross-sectional view showing an outline of the arrangement of a C-MOSFET semiconductor device according to the first embodiment of the present invention;

FIG. 13 is a cross-sectional view showing an outline of the arrangement of a MOS semiconductor device according to the second embodiment of the present invention; and FIGS. 14A to 14E are cross-sectional views showing the fabrication steps of the MOS semiconductor device according to the second embodiment.

DETAILED DESCRIPTION OF THE INVENTION

Figure 1:
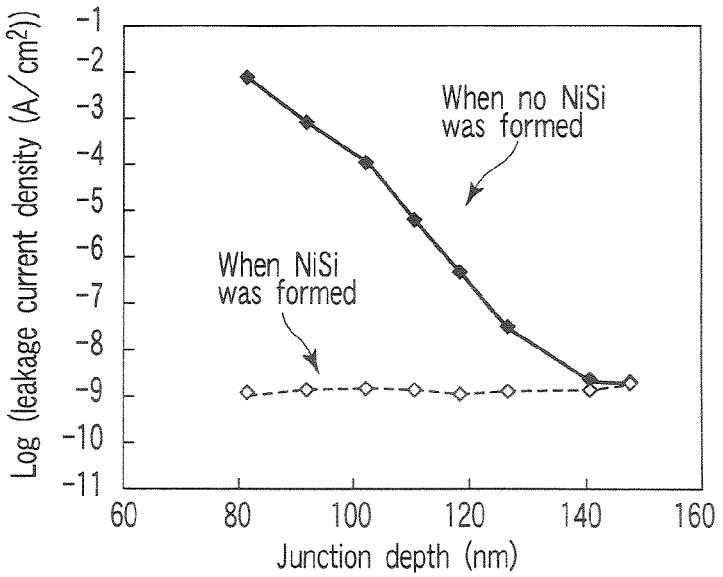
FIG. 1 is a graph showing leakage levels as a function of junction depth when NiSi was formed on n$^+$/p junctions of various depths on Si(100) substrates and subsequently annealed at 500° C. for 90 min, together with reference data of junctions without silicide layers.

First, the basic principle of the present invention will be described below before the explanation of embodiments.

As described above, in the method which increases the operating speed of a C-MOSFET by using a DSB substrate, Si crystals having different orientations have been directly bonded. Therefore, a large number of crystal defects such as dislocations caused by lattice mismatching naturally exist on the substrate-bonding plane. Also, to locally amorphousize a region of small dimensions with high spatial accuracy and to subsequently recrystallize the region with high process controllability, the single-crystal Si layer to be bonded must be very thin. Accordingly, crystal defects due to the substrate bonding comes to be formed in a shallow position just below the substrate surface (i.e., close to the pn junctions of the source/drain region).

Since the Si layer is in direct contact with the substrate without any insulating layers in-between, when a p-n junction of the source/drain diffusion region nears the bonding plane, substantial leakage current to the substrate is generated due to secondary crystal defects induced by and propagated from the crystal defects at the bonding plane. Particularly serious is the junction leakage caused by the silicidation of the p-n junction.

Generally, the resistance of a source/drain electrode must be decreased to ensure high-speed transmission of a channel current. This is realized by partially combining (silicidizing) the upper portion of the source/drain with a metal. An element such as Co, Ti, or Ni can be used as a metal for silicidation. Among them all, Ni is a silicidation metal most suitable for the LSI fabrication because it is free from detrimental narrow line effects (i.e., increase of electrical resistance when the silicide layer is formed on a narrow Si line). In addition, a metal combination reaction (silicidation reaction) between Si and Ni can occur at as low as 450° C., much lower than 800° C. necessary for the formation of CoSi$_2$. A low-electrical-resistance phase NiSi(i.e., the phase utilized for the LSI fabrication) is formed at this low temperature. On annealing at a higher temperature about 750° C., the low-resistance phase NiSi transforms into a high-resistance phase NiSi$_2$.

However, NiSi is not really a problem-free option. Even below the phase transition temperature (i.e., 750° C.), (i.e., during a low-temperature annealing) Ni atoms can rapidly diffuse from NiSi into Si and readily reach a p-n junction of the source/drain region if it is shallow. This causes significant junction leakage. Nonetheless, in order to establish a good electrical contact between NiSi, formed on very small source/drain regions, and an electrical interconnection material, through an even smaller contact holes, an annealing at about 500° C. is required. Thus, although the annealing temperature is much lower than the phase transition temperature (i.e., 750° C.), this indispensable annealing induces rapid diffusion of Ni atoms even to a depth as deep as 140 nm.

In fact, FIG. 1 plots leakage levels as a function of junction depth. A 30-nm thick NiSi was actually formed on n$^+$/p junctions of various depths on Si(100) substrates and subsequently annealed at 500° C. for 90 min. For reference, data of junctions without silicide layers are also shown. FIG. 1 reveals an excess leakage generation even at a junction depth of about 140 nm, (i.e., at a much deeper position than the bottom of the silicide film). Obviously, diffusion of Ni atoms into the substrate caused this junction leakage.

As described above, the rapid diffusion of metal atoms is unavoidable at the interface between a metallic material and Si. The metal atoms in the Si substrate form gap states and mediate the leakage current in the p/n junctions of source/drain regions. If the electric current leaks out through the source/drain junction, the device operation deteriorates and the power consumption increases. A memory device such as a DRAM loses stored information, so the original function of a semiconductor device is destroyed.

In view of its vulnerability to the leakage generation, in order to maintain proper device operation, it is critical for DSB substrate to avoid the metallic out-diffusion and the resultant leakage generation, since a Si layer is directly bonded to the substrate and associated crystal defects are formed in very shallow positions just below the surface. Otherwise, the presence of the crystal defects greatly promotes diffusion of metal atoms (transient enhanced diffusion), causes uncontrollable leakage generation, and impairs the proper function of the C-MOSFET devices formed on the DSB substrate.

The above findings of the rapid diffusion of Ni atoms to a depth as deep as 140 nm and the resultant leakage generation during the indispensable annealing (at a temperature much lower than the phase transition temperature but essential to achieve a good electrical connection between NiSi and an electrical interconnection) urged the present inventors towards further studies of the influences of impurities in Si substrate on the junction leakage caused by the thermal instability of NiSi.

Consequently, the present inventors have discovered that the junction leakage can be suppressed by introducing extrinsic impurities. Furthermore, it is found that efficiency for leakage suppression depends on the crystal orientation of the Si surface on which NiSi is formed and an effective impurity differs between Si{110} and Si{100}.

These findings will be explained in detail below with reference to FIGS. 2 to 10.

[NiSi Formed on Si(100) Plane]

First, the present inventors formed NiSi after ion-implanting F or N into a (100) Si substrate surface at an acceleration energy of 2 keV. The present inventors then annealed the substrate at 500° C. for 90 min, and measured the junction leakage to probe the impacts of the implantation (M. Tsuchiaki, Jpn. J. Appl. Phys. Vol. 44, No. 4A, pp. 1673-1681, 2005).

Figure 2:
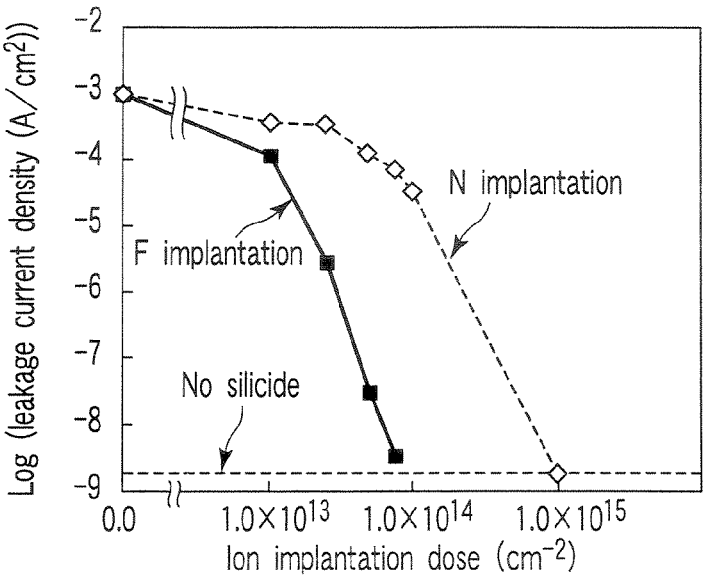
FIG. 2 is a graph showing the leakage current density at an electrical junction depth of 92 nm as a function of ion implantation dose to a Si(100) plane, for both F and N.

FIG. 2 shows the leakage current density at an electrical junction depth of 92 nm as a function of the ion implantation dose. With N implantation, a mere leakage reduction of about an order of magnitude was observed at an implantation dose of $1.0 \times 10^{14}$ cm$^{-2}$. By contrast, even at the same dosage, the leakage current is reduced significantly by about six orders of magnitude when F was ion-implanted. N ion implantation achieved the same degree of leakage reduction only when the implantation dose is raised above $1.0 \times 10^{15}$ cm$^{-2}$.

Figure 3:
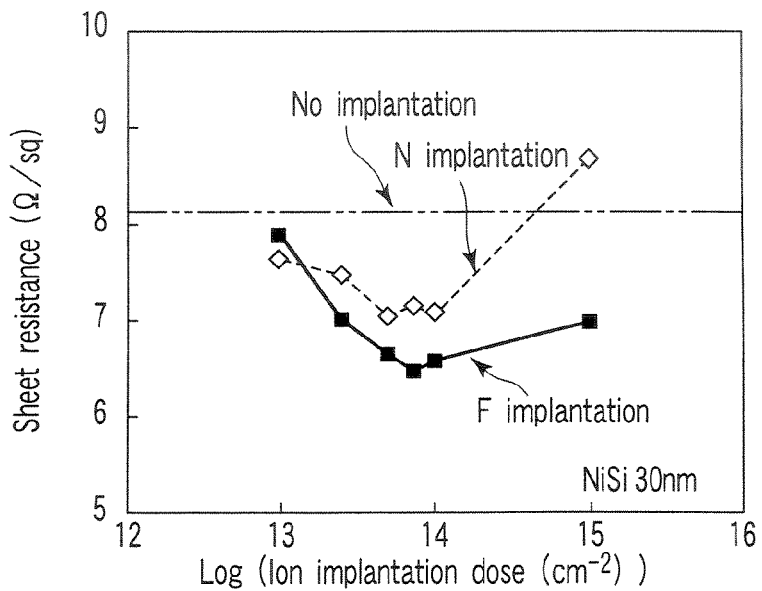
FIG. 3 is a graph showing the sheet resistance of 30-nm thick NiSi annealed at 500° C. for 90 min as a function of the ion implantation dose, for both F and N.

The present inventors further investigated the influence of this F or N ion implantation on the resistivity of the resulting NiSi layers. FIG. 3 shows the sheet resistance of 30-nm thick NiSi films annealed at 500° C. for 90 min, as a function of the ion implantation dose, for both F and N. The implantation energy was 2 keV. When N was ion-implanted, the sheet resistance has already increased at the implantation dose of $1.0 \times 10^{15}$ cm$^{-2}$, despite sufficient leakage suppression can only be expected above this dosage. On the other hand, when F was ion-implanted, the sheet resistance stays lowest for the implantation dose of $1.0 \times 10^{14}$ cm$^{-2}$, at which sufficient leakage suppressing effect has already been established. Also, the rise in the sheet resistance with F implantation at a higher dose of $1.0 \times 10^{15}$ cm$^{-2}$ was much smaller than that when N was ion-implanted.

Furthermore, detailed experiments and analyses have revealed that, with F implantation, the junction leakage does not increase with the prolonged annealing time. That is, F ion implantation completely stops the Ni infiltration into the substrate.

Now, it is clear that, on a Si(100) plane, the effective impurity capable of inhibiting the Ni infiltration and associated leakage generation without any side effects such as the rise in resistivity is F. Thus, the F implantation is a suitable option for leakage suppression applicable to an n-MOSFET to be formed on a Si(100) plane of a DSB substrate.

[NiSi Formed on Si(110) Plane]

Then, the present inventors formed NiSi after ion-implanting F or N into a (110) Si substrate surface at acceleration energy of 2 keV. The present inventors then annealed the substrate at 500° C., and measured the junction leakage to probe the impacts of the implantation. Interestingly, efficiencies for leakage suppression on Si(110) surface by these impurities are found to be quite different from that on Si(100) surface.

Figure 4:
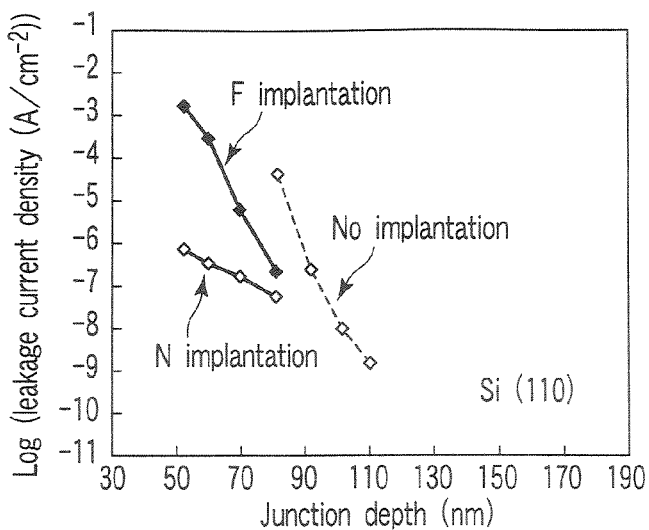
FIG. 4 is a graph showing the leakage current density as a function of the electrical junction depth when 30-nm thick NiSi was formed on Si(110) after F or N implantation at a dose of $1.0\times10^{14}$ cm$^{-2}$ and then annealed at 500° C. for 10 min, in comparison with the data without implantation.

FIG. 4 shows the leakage current density as a function of the electrical junction depth. A 30-nm thick NiSi was formed on Si(110) after F or N implantation at a dose of $1.0 \times 10^{14}$ cm$^{-2}$ and then annealed at 500° C. for 10 min. For comparison, the data without implantation were also plotted.

Like Si(100), the junction leakage is reduced by introducing an impurity on Si(110) plane. However, unlike Si(100), on Si(110), the efficiency for leakage suppression is greater for N than F. This superiority of N was particularly visible for shallow junctions. On Si(100), sufficient leakage suppression requires a very high dose (more than $1.0 \times 10^{15}$ cm$^{-2}$) of N implantation, which then brings intolerable side effects such as the rise in resistivity. However, on Si(110), sufficient leakage suppression is already established by N implantation at a low dose of $1.0 \times 10^{14}$ cm$^{-2}$.

Figure 5:
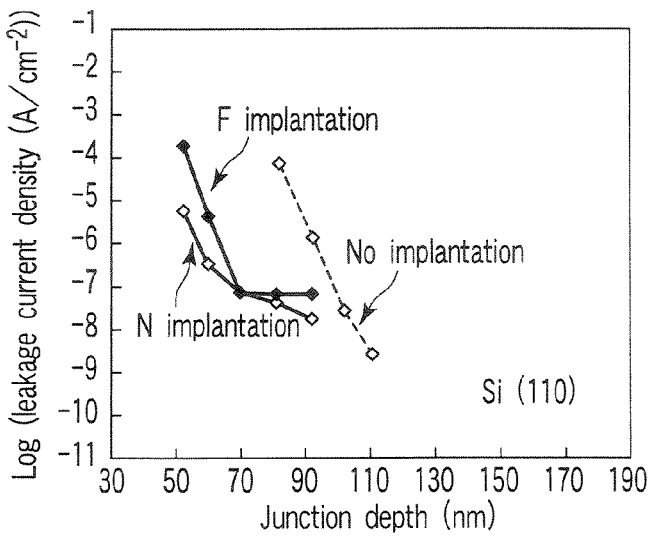
FIG. 5 is a graph showing the leakage current density as a function of the electrical junction depth when 30-nm thick NiSi was formed on Si(110) after F or N implantation at a dose of $1.0\times10^{14}$ cm$^{-2}$ and then annealed at 500° C. for 90 min, in comparison with the data without implantation.

Similarly, FIG. 5 shows the leakage current density induced by 30-nm thick NiSi formed on Si(110) after F or N implantation at a dose of $1.0 \times 10^{14}$ cm$^{-2}$ and post-annealed at 500° C. for 90 min, as a function of the electrical junction depth. For comparison, the data without implantation were also plotted.

Obviously, N implantation remains superior to F implantation even after the prolonged annealing. Notably, however, decrease of leakage current in F-implanted shallow junctions is clearly visible when compared to the previous 500° C., 10 min annealing. This suggests that specific leakage-generating and thermally-curable defects were created near the Si(110) surface by the implantation of F itself. Such defect formation by F implantation was not found on Si(100). Noticeably, for N implantation, such detrimental side effect is also completely absent regardless of the crystal plane. Evidentially, this implantation-induced defect generation is unique to F and indigenous to the Si(110) plane.

Although F-implantation-induced defects are thermally-curable, complete defect removal definitely requires an annealing at a temperature of 500° C. or higher. However, F atoms near the Si surface are highly mobile and very volatile at an elevated temperature. Therefore, pre-annealing the substrate for defect recovery prior to silicidation will end up losing precious F atoms out of the Si(110) surface. As a result, the leakage suppressing ability will simply disappear. Hence, one cannot resort to pre-annealing for removal of the F-implantation-induced defects on Si(110). Apparently, they have to be dealt with a post-annealing after the silicide formation. By contrast, N is immobile and remains near the Si substrate surface even at an elevated temperature. Thus, providing N implantation has induced defects, these defects can be easily recovered by pre-annealing before the silicidation. Now, the superiority of N over F on Si(110) becomes more and more evident.

Figure 6:
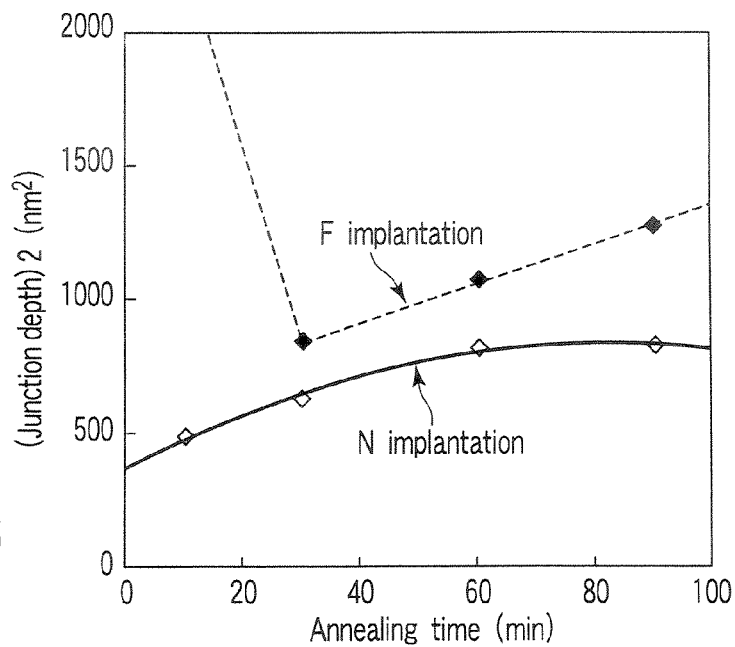
FIG. 6 is a graph showing square of electrical junction depths at the leakage current density of $1.0\times10^{-6}$ A/cm$^2$ (measured from the bottom of a silicide layer) plotted as functions of the annealing time for both N and F implanted Si(110) samples.

FIG. 6 shows square of electrical junction depths at the leakage current density of $1.0 \times 10^{-6}$ A/cm² (measured from the bottom of a silicide layer), plotted as functions of the annealing time for both N and F implanted Si(110) samples. The implantation dosage is $1.0 \times 10^{14}$ cm⁻² and the annealing temperature is 500° C.

Regarding F implantation, at an early stage of the annealing, the implantation-induced defects and associated leakage generation deep inside the Si(110) substrate contributed to the large junction depth (to be called a leakage depth hereafter). Partial recovery of the implantation-induced defects results in decrease of the leakage depth at 30 min. However, the leakage depth increases again with the prolonged thermal processing. The linear dependency of the square of the leakage depth upon the annealing time after 30 min and onward demonstrates that Ni migration from the NiSi layer into Si substrate is governed by the diffusion mechanism.

As described previously, F incorporation into the Si(100) surface completely stops the Ni infiltration over a certain depth (M. Tsuchiaki, Jpn. J. Appl. Phys., Vol. 44, No. 4A, pp. 1673-1681, 2005). Notably, however, here on the Si(110) substrate, the leakage suppression by F is quite limited and Ni continues to diffuse into the substrate unstoppably. The above data has revealed, for the first time, the strong dependency of F's leakage suppressing ability on the crystal orientation of Si substrate. Through further investigation, the present inventors even found that implantation of F somehow accelerate the Ni infiltration into the Si substrate along [110] direction (the depth direction perpendicular to the Si(110) plane). Thus, a long-time post-annealing for removal of the F implantation-induced defects on Si(110) is of no use since it will only bring another leakage due to the uncontrollable Ni infiltration. This constitutes fundamental difficulty pertinent to leakage suppression by F implantation on Si(110).

On the other hand, in the case of N implantation, the implantation itself forms no specific defects near the Si(110) surface, so it is possible to suppress leakage of very shallow junctions. In fact, the leakage suppression by N is constantly superior to that of F as demonstrated by always-smaller leakage depths during the annealing in FIG. 6. Also, unlike F implantation, where Ni continues to diffuse into the substrate indefinitely, with N implantation, Ni infiltration slows down with time and eventually comes to a complete halt at a certain junction depth. This means the superiority of N over F becomes more conspicuous for shallower junctions and longer-time annealings.

Figure 7:
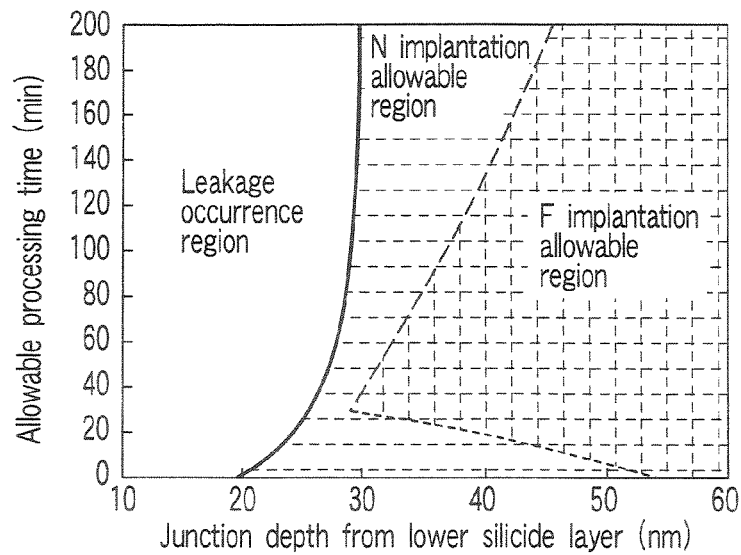
FIG. 7 is a graph showing the maximum allowable times of annealing at 500° C. to keep the leakage current density below $1.0\times10^{-6}$ A/cm$^2$, plotted as functions of the electrical junction depth measured from the bottom of a silicide layer formed on the Si(110) substrate, for both F implantation and N implantation.

To make this clearer, FIG. 7 plots the maximum allowable times of annealing at 500° C. to keep the leakage current density below $1.0 \times 10^{-6}$ A/cm², as functions of the electrical junction depth measured from the bottom of a silicide layer formed on the Si(110) substrate, for both F implantation and N implantation.

Clearly, in a depth range between 20 nm and 30 nm, only N incorporation can suppress the junction leakage current below $1.0 \times 10^{-6}$ A/cm². Due to the formation of implantation-induced defects near the Si(110) surface and subsequent Ni infiltration away from the NiSi layer into the Si substrate, F implantation cannot effectively suppress leakage for a shallow junction like this. On the other hand, thanks to the defect-free nature of the N implantation, junction leakage within this depth range can be suppressed by restricting the annealing time to be equal to or shorter than a maximum allowable time Ta, formulated below by the following expression (A), as a function of the electrical junction depth Xj from the bottom of the silicide layer.

$$Ta = c_3 \times ln\{c_2/(c_1 - Xj^2)\} \text{ [min]} \quad (A)$$

where,

Xj: electrical junction depth from silicide layer lower surface in [nm]

Ta: maximum allowable time in [min]

$c_1$: 907 [m²]

$c_2$: 533 [m²]

$c_3$: 39.3 [min]

For a junction deeper than this range, N implantation practically stops Ni infiltration before reaching the junction depth, and limitations on the annealing time can be effectively lifted.

When F is implanted, however, Ni keeps migrating unlimitedly into the Si substrate under the diffusion mechanism. To suppress the leakage current, therefore, it is necessary to restrict the annealing time to be equal to or shorter than a maximum allowable time Tb, expressed below by (B) as a function of the electrical junction depth Xj from the bottom of the silicide layer.

$$Tb = (Xj^2 - c_4)/c_5 \text{ [min]} \quad (B)$$

where,

Xj: electrical junction depth from silicide layer lower surface in [nm]

Tb: maximum allowable time in [min]

$c_4$: 633 [m²]

$c_5$: 7.36 [min]

Finally, it should be mentioned here that the leakage current density cannot be suppressed below $1.0 \times 10^{-6}$ A/cm² at a junction depth shallower than 20 nm due to an intrinsic Ni infiltration during the silicidation reaction. That is, 20 nm is the shallowest possible depth (from the bottom of the silicide layer) of a leakage-free junction achievable with a NiSi layer.

Figure 8:
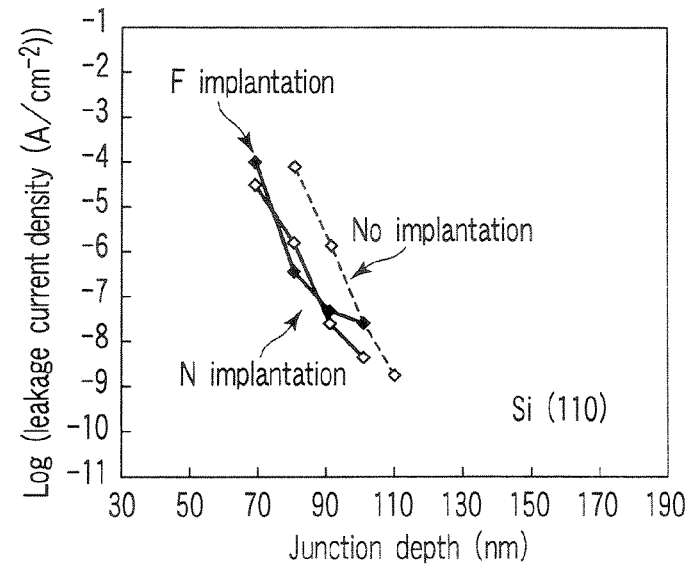
FIG. 8 is a graph showing the leakage current density induced by 30-nm thick NiSi formed on Si(110) after F or N implantation at a dose of $1.0\times10^{13}$ cm$^{-2}$ and post-annealed at 500° C. for 90 min, as a function of the electrical junction depth, in comparison with the data without implantation.

FIG. 8 shows the leakage current density induced by 30-nm thick NiSi formed on Si(110) after F or N implantation at a dose of $1.0 \times 10^{13}$ cm⁻² and post-annealed at 500° C. for 90 min, plotted as a function of the electrical junction depth. For comparison, the data without implantation were also plotted.

Regardless of the implanted impurities, leakage suppressing effect is almost negligible with this low dose of $1.0 \times 10^{13}$ cm⁻². Apparently, in order to suppress the junction leakage caused by the NiSi layer formed on the Si(110), N introduction at an areal density exceeding $1.0 \times 10^{13}$ cm⁻² is required. Preferably, in order to achieve sufficient leakage suppression, N should be implanted at an areal density of $1.0 \times 10^{14}$ cm⁻² or more.

Remembering the significant increase of NiSi resistivity at a very high-dose N implantation as shown in FIG. 3, in order to obtain sufficient leakage suppression without this resistivity rise, implantation dosage of N should be in a range between $1.0 \times 10^{14}$ cm⁻² and $1.0 \times 10^{15}$ cm⁻², desirably, between $1.0 \times 10^{14}$ cm⁻² and $5.0 \times 10^{14}$ cm⁻².

Finally, the present inventors have investigated how the implanted F atoms are incorporated in the silicide film, improving the thermal stability of the resultant NiSi on Si(100), preventing Ni infiltration into the Si substrate, and suppressing the leakage generation. Likewise, N incorporation in the silicide film, which improves the thermal stability of the resultant NiSi on Si(110), prevents Ni infiltration into the Si substrate, and suppresses leakage generation, is also analyzed.

Figure 9:
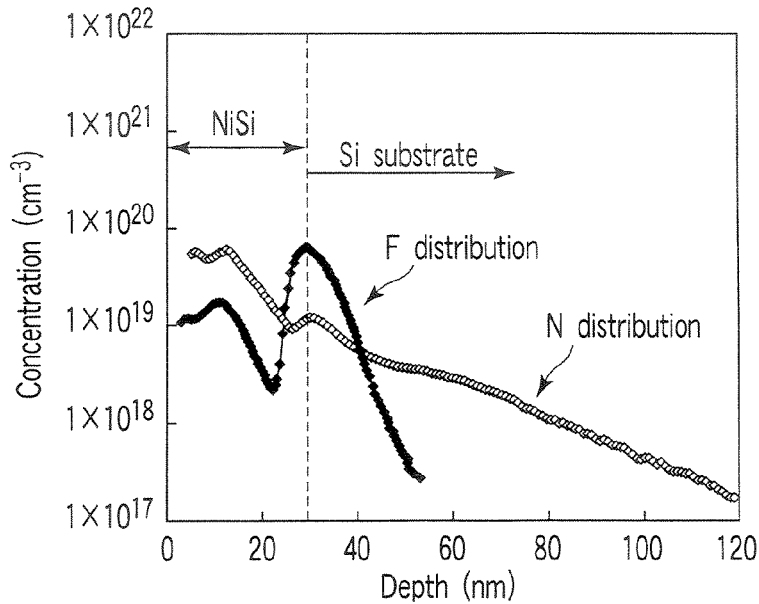
FIG. 9 is a graph showing the F and N distributions in and around 30-nm thick NiSi layers formed after implanting F and N at a dose of $1\times10^{14}$ cm$^{-2}$ into Si(100) and Si(110) substrates, respectively.

FIG. 9 shows the results of SIMS measurements of the F and N distributions in and around NiSi layers. 30-nm thick NiSi films were formed after implanting F and N at a dose of $1 \times 10^{14}$ cm⁻² into Si(100) and Si(110) substrates, respectively.

The total amount (areal density) of F incorporated into the NiSi on Si(100) was $5.0 \times 10^{13}$ cm$^{-2}$. The F distribution had a peak at the NiSi/Si interface with a concentration of $6.0 \times 10^{19}$ cm$^{-3}$.

The total amount (areal density) of N incorporated into the NiSi on Si(110) was $8.5 \times 10^{13}$ cm$^{-2}$. The N distribution had a peak in the NiSi film with a concentration of $5.0 \times 10^{19}$ cm$^{-3}$, while the concentration at the NiSi/Si interface was $1.0 \times 10^{19}$ cm$^{-3}$. Of course, with N implantation at a dose of $1 \times 10^{15}$ cm$^{-2}$, the total amount (areal density) of N incorporated into the NiSi on Si(110) was $8.5 \times 10^{14}$ cm$^{-2}$. N distribution deeper inside the Si substrate compared to F distribution is due to the channeling effect, which is more prominent for Si(110) than Si(100).

The incorporation of F and N atoms with the above identified amounts and distributions leads to dramatic improvement of NiSi's thermal stability on Si(100) and Si(110) respectively, thereby preventing the release of Ni atoms from the NiSi layer and obstructing the Ni infiltration into the Si substrate. With F implantation over $1 \times 10^{14}$ cm$^{-2}$ dosage into Si(100) substrate before silicidation, the amount and distribution of the incorporated F atoms into the resulting NiSi film upon silicidation exceeds the above identified values and the resistance against heat stimulus increases significantly. Likewise, when about $1 \times 10^{14}$ cm$^{-2}$ or more of N atoms are implanted into Si(110) substrate before silicidation, without introducing F atoms which would have adverse side effects indigenous to Si(110), the resulting NiSi film incorporates N atoms upon silicidation with the amount and distribution exceeding the above identified values and its thermal stability improves drastically.

Therefore, by pre-silicide F introduction into source/drain regions of an n-MOSFET to be formed on Si(100) surface of a DSB substrate and by pre-silicide N introduction into source/drain regions of a p-MOSFET to be formed on Si(110) surface of the DSB substrate, the leakage currents of both types of the MOSFETs can be efficiently suppressed. The resulting leakage-free C-MOSFET device can enjoy maximum mobilities of both polarities simultaneously, thereby increasing the operating speed of the C-MOSFET circuit.

In addition, the improved thermal stability of the silicide enables an annealing at about 500° C. to establish a good electrical contact between NiSi formed on very small source/drain regions and an electrical interconnection material, through an even smaller contact holes.

In this way, it is possible to form a leakage-free silicide layer on a DSB substrate while maintaining a shallow source/drain junction. Thus, a high-speed, low-power advanced C-MOSFET can be realized without the short-channel effect.

As described above, $1.0 \times 10^{14}$ to $1.0 \times 10^{15}$ cm$^{-2}$ of N atoms are introduced into a first region for forming a p-MOSFET region, and $1.0 \times 10^{14}$ cm$^{-2}$ or more of F atoms are introduced into a second region for forming an n-MOSFET, prior to silicidation. The Si surface of the first region is a Si$\{110\}$ plane, and that of the second region is a Si$\{100\}$ plane. The areal density of N atoms incorporated in a first silicide layer on first source/drain regions ranges from $8.5 \times 10^{13}$ to $8.5 \times 10^{14}$ cm$^{-2}$, and the areal density of F atoms incorporated in a second silicide layer on second source/drain regions is $5.0 \times 10^{13}$ cm$^{-2}$ or more. As a result, the diffusion of metal atoms released from the silicide layer to the DSB substrate can be prevented. Consequently, low-leakage shallow source/drain junctions can be realized with their upper portions silicidized to reduce the electrical resistance.

Embodiments of the present invention will be explained below with reference to the accompanying drawings.

First Embodiment

This embodiment realizes a high-speed, low-power C-MOSFET device on a DSB substrate by pre-silicide F implantation into source/drain regions of an n-MOSFET on Si(100) surface and by pre-silicide N implantation into source/drain regions of a p-MOSFET on Si(110) surface. With simple fabrication steps disclosed below, leakage currents of the MOSFETs of the two polarities can be suppressed efficiently, while maintaining shallow source/drain diffusion regions as well as a good electrical contact with an interconnection metal, thanks to the improved thermal stability of NiSi layers.

FIG. 11 is a cross-sectional view showing an outline of the arrangement of a C-MOSFET semiconductor device according to the first embodiment of the present invention.

Referring to FIG. 11, reference numeral 10 denotes a p-type (110) single-crystal Si substrate. A device isolation insulating film 13 separates the surface of the substrate 10 into a first region 100 for forming a p-MOSFET and a second region 200 for forming an n-MOSFET. The surface of the first region 100 is a Si$\{110\}$ plane, and that of the second region 200 is a Si$\{100\}$ plane. An n-well 101 is formed in the first region 100, and a p-well 201 is formed in the second region 200.

A first gate electrode 103 is formed on the n-well 101 via a gate insulating film 102. Sidewall insulating films 105 are also formed on both sides of the gate electrode. Source/drain extension regions 104, i.e., 104a and 104b are formed in the surface portion of the n-well region 101 so as to sandwich the gate electrode. Source/drain diffusion regions (source/drain regions) 106, i.e., 106a and 106b are respectively formed outside the source/drain extension regions 104a and 104b. Silicide layers 115, i.e., 115a and 115b are respectively formed on the source/drain diffusion regions 106a and 106b, and a silicide layer 116 is formed on the gate electrode 103.

A second gate electrode 203 is formed on the p-well 201 via a gate insulating film 202. Sidewall insulating films 205 are also formed on both sides of the gate electrode. Source/drain extension regions 204, i.e., 204a and 204b are formed in the surface portion of the p-well region 201 so as to sandwich the gate electrode. Source/drain diffusion regions (source/drain regions) 206, i.e., 206a and 206b are respectively formed outside the source/drain extension regions 204a and 204b. Silicide layers 215, i.e., 215a and 215b are respectively formed on the source/drain diffusion regions 206a and 206b, and a silicide layer 216 is formed on the gate electrode 203.

A silicon nitride film 31 is disposed on the exterior surface of the above structure, and an interlayer dielectric film 32 is formed on the silicon nitride film 31 to planarize the upper surface. A contact hole for connecting to a source or drain is formed in each of a p-MOS region and n-MOS region through the silicon nitride film 31 and the interlayer dielectric film 32. In the p-MOS region, a W plug 123 fills up the contact hole via a barrier metal layer 122. In the n-MOS region, a W plug 223 fills up the contact hole via a barrier metal layer 222.

An interlayer dielectric film 35 is formed over the above structure, and Cu films 125 and 225 are embedded in ditches formed in the interlayer dielectric film 35. A silicon nitride film 37 is formed over the outer surface.

A method of fabricating the MOS semiconductor device of this embodiment will be explained below with reference to FIGS. 12A to 12I.

Figure 12A:
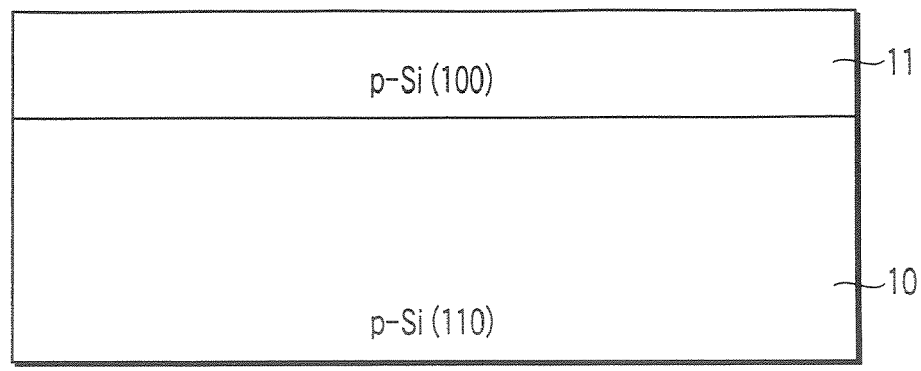
FIGS. 12A to 12I are cross-sectional views showing the fabrication steps of the MOS semiconductor device according to the first embodiment.

First, as shown in FIG. 12A, a p-type single-crystal Si substrate 11 having a (100) major surface is directly bonded to the surface of a p-type single-crystal Si substrate 10 having a (110) major surface. To directly bond the single-crystal Si substrates 10 and 11, the surfaces of the single-crystal Si substrate 10 and single-crystal Si substrate 11 are first treated with a diluted HF solution or the like, and then compressed to each other. Subsequent annealing in, e.g., Ar ambient promotes formation of chemical bonding between some Si atoms existing on the two surfaces, resulting in the direct substrate bonding. Of course, due to the incompatible crystallinity and mismatching lattice arrangement, not all Si atoms on the bonding plane can participate in the chemical bonding. Also, even when chemical bonds are formed, the lattice structure of either one of the substrates must be distorted to conform to the different spatial configuration for the interfacial atoms to bond. It should be noted that, as a consequence, many crystal defects such as dislocations and dangling Si atoms are formed on the bonding plane.

Figure 12B:
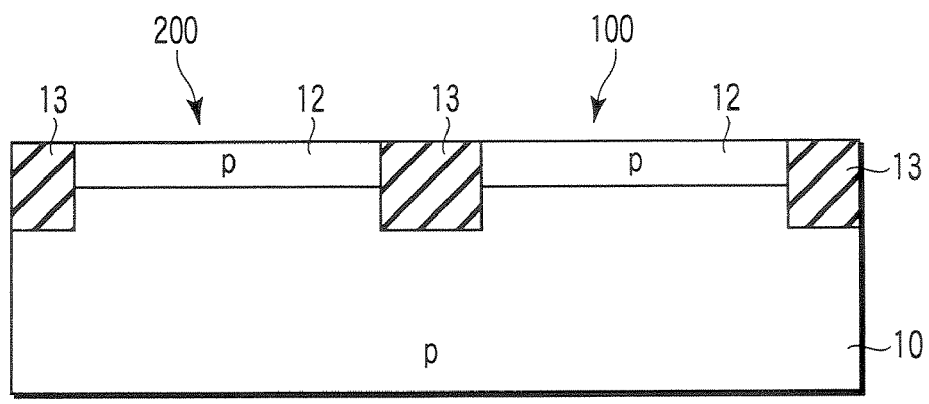

Then, as shown in FIG. 12B, the single-crystal Si substrate 11, which is directly bonded to the surface of the single-crystal Si substrate 10, is thinned down by using a well-known method such as Chemical Mechanical Polishing (CMP), thereby forming a single-crystal Si layer 12. Subsequently, shallow trenches reaching the single-crystal Si substrate 10 through the single-crystal Si layer 12 are formed, and an insulating material (device isolation insulating film) 13, e.g., a silicon oxide film is formed to fill up these shallow trenches to the substrate surface. The device isolation insulating film 13 thus defines a prospective p-MOSFET region (first region) 100 and prospective n-MOSFET region (second region) 200. A semiconductor substrate having these device isolation regions can be obtained by effective methods of the well-known techniques, e.g., by forming trenches in the substrate surface by lithography, Reactive Ion Etching (RIE), or the like, depositing an insulating film by Chemical Vapor Deposition (CVD), and planarizing the substrate surface by CMP.

Figure 12C:
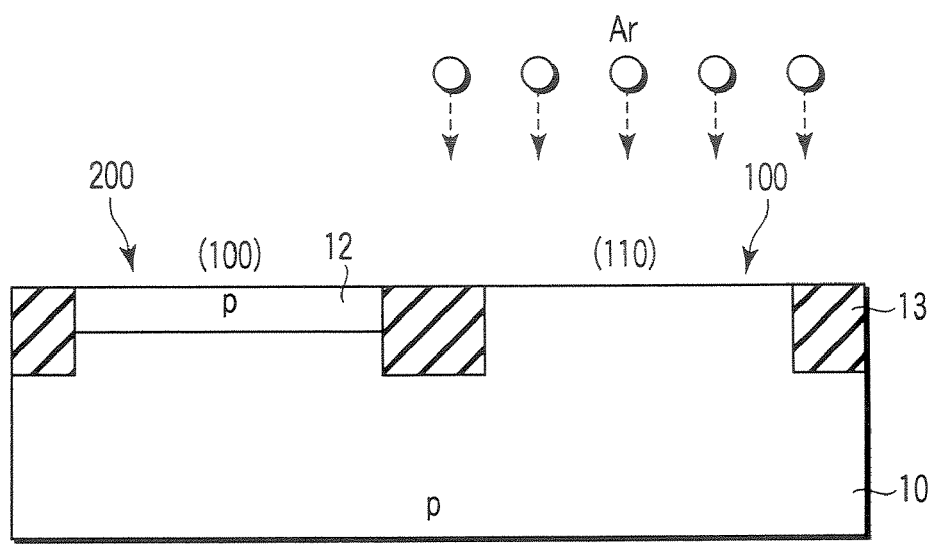

As shown in FIG. 12C, Ar or the like is ion-implanted in only the first region 100 by an effective method of the well-known techniques such as lithography and ion implantation, thereby completely amorphousizing the single-crystal layer 12 in this portion. Since, subsequent recrystallization progresses in reference to the crystallinity of the lower single-crystal Si substrate 10, which is in direct contact with the amorphousized Si layer, the single-crystal Si layer 12 in the first region 100 turns into a single-crystal region consistent with the single-crystal Si substrate 10, and the surface of the region is converted into Si(110). On the other hand, the single-crystal Si layer 12 in the second region 200 remains unchanged. In this manner, the DSB substrate is obtained.

For successful execution of the above steps, the thickness of the single-crystal Si layer 12 is an important factor. In order to completely and exclusively amorphousize only the single-crystal Si layer 12 in the small first region 100, locating in the very close vicinity of the single-crystal Si layer 12 in the second region 200, with high spatial accuracy and also in order to locally recrystallize the microregion with high process controllability, while maintaining the single-crystal Si layer 12 in the adjacent second region 200, as a matter of course, the single-crystal Si layer 12 must be thinner than the device isolation insulating film 13. Accordingly, crystal defects at the bonding plane of the DSB substrate come to be located in extremely shallow positions just below the active device surfaces. Naturally, if p-n junctions of source/drain diffusion regions are formed close to this bonding plane, large junction leakage will be generated due to the primary crystal defects existing near the substrate bonding plane or the secondary crystal defects derived and propagated from the substrate bonding plane.

Also critical, for high-yield processing of the above steps, is the choice of the MOSFET polarity for which the above amorphousization/recrystallization procedure is applied. Generally, in a C-MOSFET circuit including peripheral devices, the number and area of n-MOSFET regions are larger than those of p-MOSFET. Since the recrystallization process may not always accomplish perfect crystallinity and sometimes a fatal and destructive extended crystal defect reaching the surface could be formed at a certain probability, conversion of the surface orientation in the prospective p-MOSFET regions (i.e., amorphousization/recrystallization procedure on regions smaller in number and area) is less likely to suffer from such devastating and crippling crystal defects than performing the same processes in the prospective n-MOSFET regions. Therefore, as in this embodiment, converting the surface orientation by amorphousization/recrystallization in the prospective p-MOSFET region 100 is very effective to increase the fabrication yield.

Figure 12D:
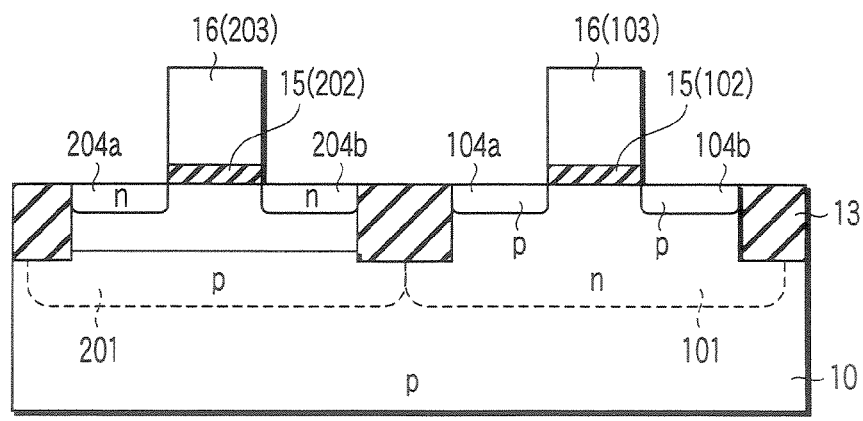

Then, as shown in FIG. 12D, an n-type well region 101 and p-type well region 201 are formed in the DSB substrate by effective methods of the well-known techniques such as ion implantation and annealing. Subsequently, an oxynitride film or the like having a thickness of 5 nm is formed as a gate insulator 15 on the entire surface of the DSB substrate by using an effective method of the well-known techniques such as thermal oxynitridation. Then, a poly-Si film or the like having a thickness of 200 nm is deposited as a gate electrode material 16 by using an effective method of the well-known techniques such as CVD. After that, a mask material such as a photoresist is formed by lithography and the gate insulating films 102 and 202, a first gate electrode 103, and a second gate electrode 203 are formed by RIE or the like.

Subsequently, a p-type impurity is ion-implanted by using the first gate electrode 103 and a photoresist (not shown) covering the second region 200 as masks. This step forms shallow diffusion regions 104, i.e., 104a and 104b having the conductivity type opposite to that of the well region 101 and serving as source/drain extension regions, on both sides of the first gate electrode 103.

Similarly, an n-type impurity is ion-implanted into both sides of the second gate electrode 203 by using the second gate electrode 203 and a photoresist (not shown) covering the first region 100 as masks. This step forms shallow diffusion regions 204, i.e., 204a and 204b having the conductivity type opposite to that of the well region 201 and serving as source/drain extension regions, on both sides of the second gate electrode 203.

Figure 12E:
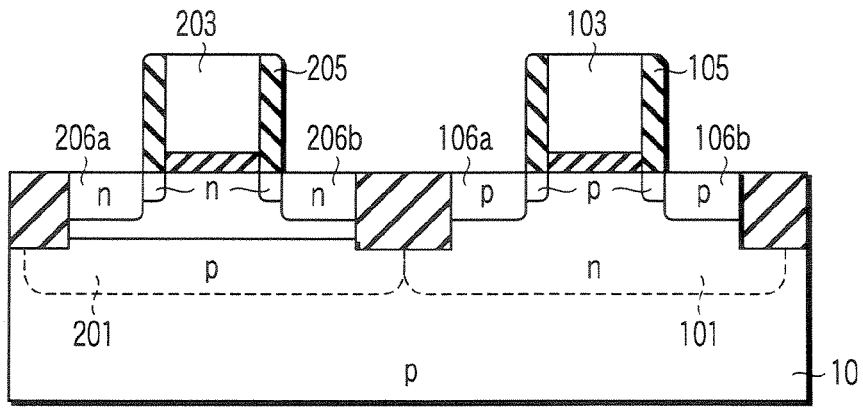

Next, as shown in FIG. 12E, a silicon nitride film or the like having a thickness of 20 nm is deposited on the entire surface by, e.g., CVD, and selectively left behind on the two sides of each of the gate electrodes 103 and 203 by anisotropic etching such as RIE. This step forms gate sidewall insulating films 105 on the side portions of the first gate electrode 103, and gate sidewall insulating films 205 on the side portions of the second gate electrode 203.

Subsequently, the first gate electrode 103, gate sidewall insulating films 105, and a photoresist (not shown) covering the second well region 201 are used as masks to ion-implant a p-type impurity into the two sides of the first gate electrode 103. This step forms diffusion regions 106, i.e., 106a and 106b serving as first source/drain regions and having the conductivity type opposite to that of the well region 101, on the both sides of the first gate electrode 103. During this step, the p-type impurity is also implanted into the first gate electrode 103 as well.

Likewise, the second gate electrode 203, gate sidewall insulating films 205, and a photoresist (not shown) covering the first well region 101 are used as masks to ion-implant an n-type impurity into the two sides of the second gate electrode 203. This step forms diffusion regions 206, i.e., 206a and 206b serving as second source/drain regions and having the conductivity type opposite to that of the well region 201, on the both sides of the second gate electrode 203. During this step, the n-type impurity is also implanted into the second gate electrode 203 as well.

These impurities are then activated by Rapid Thermal Annealing (RTA). The source/drain diffusion regions 106 and 206 are formed to a depth of, e.g., 50 nm from the Si substrate surface.

Figure 12F:
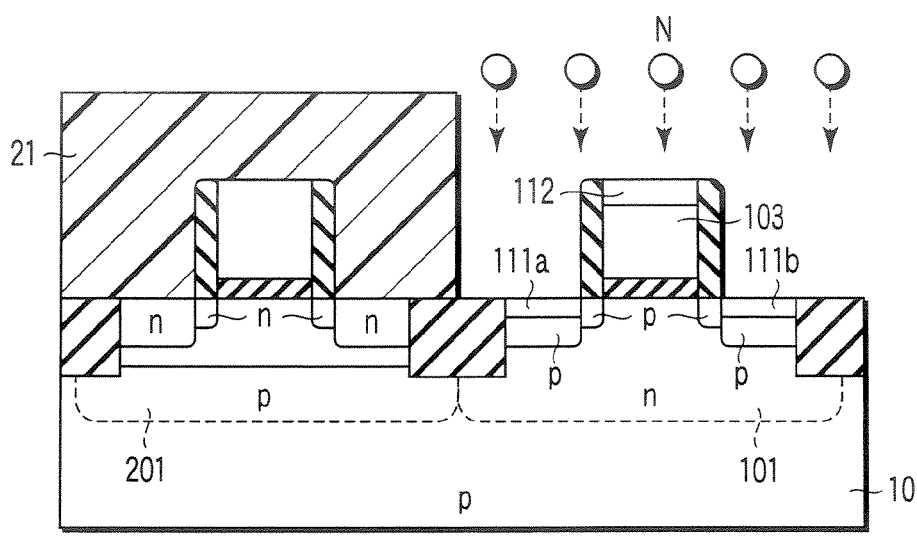

Then, as shown in FIG. 12F, a photoresist 21 is formed on the second well region 201 as a mask to exclusively ion-implant N atoms at a dose of $1 \times 10^{14}$ cm$^{-2}$ on the first well region 101 at an acceleration energy of 2 keV. To avoid the channeling effect, which becomes conspicuous for implantation into a Si{110} plane, it is effective to incline the incident direction by, e.g., about 30° from the normal direction of the surface. This keeps the range of N atoms implanted into the Si substrate to be 10 nm or less.

Consequently, N-containing regions 111a, 111b, and 112 about 10 nm thick are formed on the diffusion layers 106 and on gate electrode 103. The implantation depth of N ions is desirably equal to or smaller than the thickness of Si to be consumed by the ensuing silicidation reaction. When 30-nm thick NiSi is to be formed, the thickness of Si consumption is about 24 nm. Therefore, the following silicidation reaction will completely consume these N-containing regions 111a, 111b, and 112 which are about 10 nm thick.

It should be noted here that, unlike F, N does not escape from the Si substrate surface even when annealing is performed after implantation. Accordingly, it is possible to introduce N atoms together with the ion implantation for forming the diffusion regions 106. This obviates the need to form the specific photoresist 21 just for N implantation, and simplifies the process. In addition, amorphousized surfaces of the diffusion region 106 by p-type impurity implantation will prevent the channeling of N atoms, so shallow N-containing regions can be formed more easily.

Figure 12G:
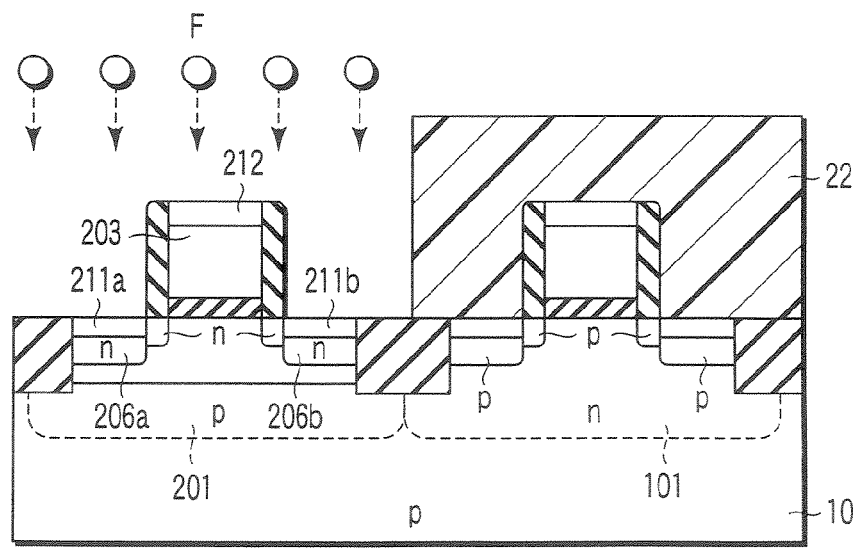

Next, as shown in FIG. 12G, a photoresist 22 formed on the first well region 101 is used as a mask for selective ion-implantation of F atoms at a dose of $1 \times 10^{14}$ cm$^{-2}$ on the second well region 201 at an acceleration energy of 2 keV. Consequently, F-containing regions 211a, 211b, and 212 about 10 nm thick are formed on the diffusion regions 206 and gate electrode 203.

If F ions are implanted from the normal direction, some F ions may reach the bonding plane by the channeling effect. As described previously, many crystal defects such as dislocations and dangling bonds are formed at the bonding plane just below the substrate surface in the second region 200. F atoms tend to combine with defect-forming unstable Si atoms, thereby physically stabilizing and electrically inactivating the crystal defects. Accordingly, it is possible to prevent the formation and propagation of secondary defects derived from the crystal defects at the bonding plane. It is also possible to hinder detrimental trapping of contaminating impurities by the crystal defects, which could lead to an increase of their electrical activities.

Since F implantation to the Si(100) plane produces no specific leakage-generating defects unlike the implantation to Si(110) plane, the selective introduction of F atoms on the second region 200 can effectively suppress leakage generation from p-n junctions of source/drain regions, even they are located very close to the bonding plane. After silicidation, the areal density of incorporated F atoms into the NiSi film would become about $5.0 \times 10^{13}$ cm$^{-2}$. Therefore, about $5.0 \times 10^{13}$ cm$^{-2}$ of F atoms implanted here will remain in the Si substrate and contribute to the stabilization of the DSB bonding plane. Of course, the F atoms to be incorporated into NiSi during ensuing silicidation will drastically improve the thermal stability of NiSi. Thus, even with an annealing at 500° C., a significant leakage reduction by about six orders of magnitude will be expected when compared to a case in which no F is implanted.

It should be also mentioned here that F implantation on the first region 100 needs to be avoided to prevent formation of unnecessary leakage-generating defects indigenous to F implantation on Si(110), which could otherwise spoil the beneficial effects of N and even accelerate Ni infiltration.

Also, F is desirably introduced immediately before silicidation, since F atoms near the Si surface could easily leave from the surface upon annealing. If F is implanted simultaneously with ion implantation for forming the diffusion layers 206, the implanted F atoms diffuse out from the surface during the subsequent impurity-activating step. As a consequence, the junction leakage suppressing effect on the Si(100) plane will disappear.

As a next step, a Ni film having a film thickness of, e.g., 12 nm is deposited on the entire surface by using an effective method of the well-known techniques, e.g., sputtering. On this Ni film, a capping layer such as Ti or TiN could be deposited if necessary. Subsequent rapid thermal annealing (RTA) in nitrogen at, e.g., 450° C. for 30 sec, promotes selective silicidation reaction between Ni and Si where they are in direct contact. Unreacted Ni is then removed by dipping the substrate in a mixed solution of sulfuric acid and hydrogen peroxide.

Figure 12H:
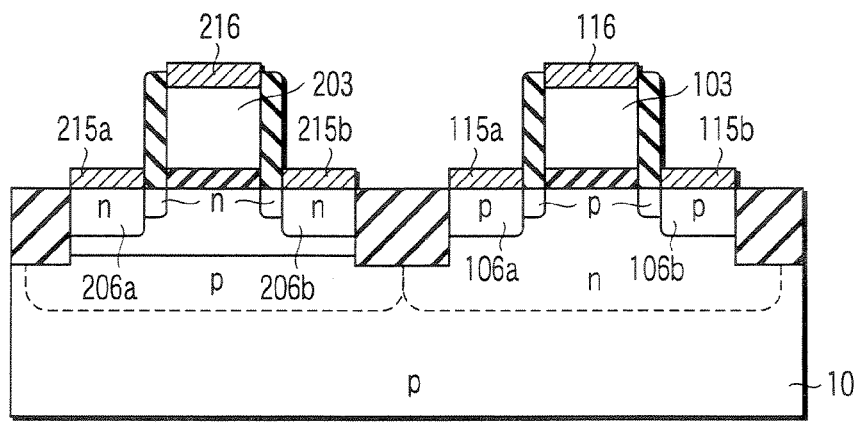

Consequently, as shown in FIG. 12H, NiSi films 115, i.e., 115a and 115b are formed on the first source/drain regions 106, and a NiSi film 116 is formed on the first gate electrode 103. Also, NiSi films 215, i.e., 215a and 215b are formed on the second source/drain regions 206, and a NiSi film 216 is formed on the second gate electrode 203. The film thickness of the NiSi films 115, 116, 215, and 216 is about 28 nm.

During this silicidation, a portion of N atoms in the N-containing regions 111 and 112 on the prospective p-MOSFET region 100 is incorporated in the NiSi film and also at the NiSi/Si interface. In the present case, the areal density of N in the NiSi film is $8.5 \times 10^{13}$ cm$^{-2}$, the peak N concentration in the NiSi film is $5.0 \times 10^{19}$ cm$^{-3}$, and the concentration of N at the NiSi/Si interface is $1.0 \times 10^{19}$ cm$^{-3}$. Thanks to the improved thermal stability by the N incorporation, NiSi on Si(110) withstands an annealing at 500° C. without leakage generation. For example, if the depth of the diffusion layers 106 is 50 nm, the junction depth from the bottom of the silicide layer is about 26 nm, so the present NiSi layer can endure an annealing at 50° C. for up to 30 min in accordance with approximate expression (A).

Providing that F is implanted together with N on the prospective p-MOSFET region 100 at a dose of $1 \times 10^{14}$ cm$^{-2}$, the leakage current would be increased by more than one order of magnitude by the defect generation inherent to F implantation on Si(110) plane. Therefore, in order for this adverse side effect of F implantation to be negligible, the F dosage in the N-containing regions 111 and 112 must be kept below $1 \times 10^{13}$ cm$^{-2}$. This means that the maximum allowable areal F density in the NiSi film and the maximum F concentration at the NiSi/Si interface are $5.0 \times 10^{12}$ cm$^{-2}$ and $6.0 \times 10^{18}$ cm$^{-3}$, respectively. Since no leakage suppressing effect can be expected for a low-dose F implantation below $1 \times 10^{13}$ cm$^{-2}$, there is no practical reason to deliberately perform such detrimental (or merit-less at most) F implantation into the diffusion layers 106 on the Si(110) plane.

On the other hand, a portion of F atoms in the F-containing regions 211 and 212 on the prospective n-MOSFET region 200 is incorporated in the NiSi film and also at the NiSi/Si interface during the silicidation. In the present case, the areal F density in the NiSi film is $5.0 \times 10^{13}$ cm$^{-2}$, and the maximum F concentration at the NiSi/Si interface is $6.0 \times 10^{19}$ cm$^{-3}$. Thanks to the improved thermal stability by the F incorporation, NiSi on Si(100) withstands an annealing at 500° C. The leakage current can be reduced by about six orders of magnitude when compared to a case without F implantation.

Figure 12I:
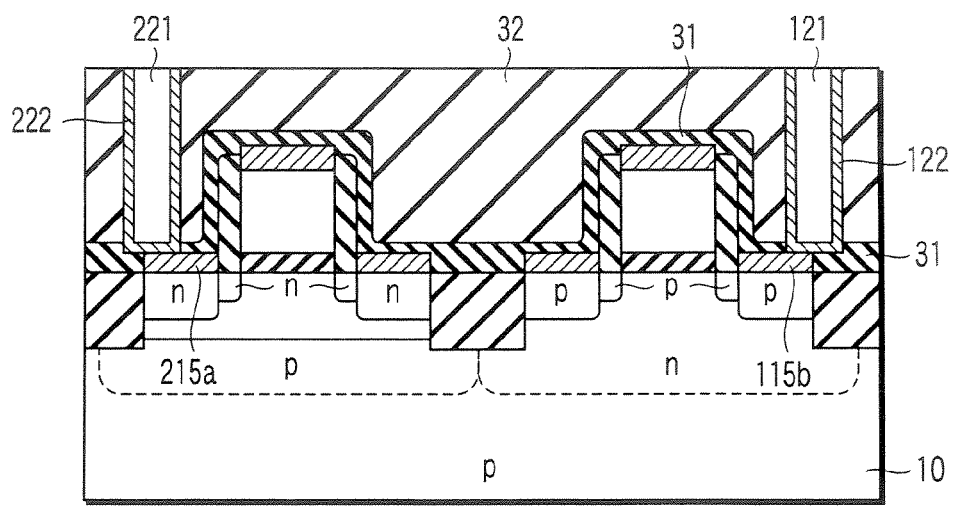

Then, as shown in FIG. 12I, a silicon nitride film 31 having a thickness of, e.g., 20 nm is deposited conformaly and uniformly on the exterior surface of the above structure so as to cover the NiSi films 115, 116, 215, and 216. CVD using $Si_2Cl_6$ and $NH_3$ as supply gases or Atomic Layer Deposition (ALD) using $SiH_2Cl_4$ and $NH_3$ can achieve this uniform and conformal deposition of the silicon nitride film at a low temperature. This silicon nitride film 31 serves as a barrier layer and also functions as an etching stop layer, i.e., as a liner layer during ensuing contact-hole formation process through an interlayer dielectric film thereon. As explained below, if the liner layer is formed evenly on the exterior surface of the substrate including the device isolation regions, contact holes can be formed without precisely aligning them to respective NiSi regions (borderless contact formation). This simplifies the device fabrication process and reduces the fabrication cost.

The silicon nitride film functioning as a liner layer should be dense and uniform as well as conforming to the outer surface of fine structures of small devices. This is because a porous film cannot serve as a barrier nor an etching stop layer. A non-uniform film unable to conform to fine structures is totally useless as a barrier and etching stop layer of small devices. To obtain a dense and uniform silicon nitride film, CVD or ALD described above is more suitable than low-temperature formation by Plasma Enhanced CVD (PECVD).

In fact, the present inventors have found that the optical refractive index, which can be used as a gauge of the denseness of a film (the larger the refractive index, the denser the film), strongly depends on the film formation temperature.

FIG. 10 shows the relationship between the film formation temperature and optical refractive index of a silicon nitride film for each of CVD and ALD. As shown in FIG. 10, the refractive index of the film (i.e., denseness) increases with the formation temperature for both CVD and ALD. Notably, regardless of the film formation method, the refractive index comes to exceed 1.89 when the film is formed at a temperature over 0° C. In the present embodiment, annealing at 500° C., which would otherwise generate substantial leakage, is allowed because of the improved thermal stability by N and F. Thus, it should be noted that, such a dense silicon nitride film with a refractive index of 1.89 or more, which is very suitable for a liner layer, is available when the present technique for thermal stabilization is employed.

Also, as shown in FIG. 12I, a silicon oxide film 32 is deposited as an interlayer dielectric film on the silicon nitride liner layer 31. A silicon oxide film having a planar upper surface can be formed at a low temperature by supplying $O_3$ and $Si(OC_2H_5)_4$ (TEOS) gases at, e.g., 400° C. The silicon oxide film 32 can otherwise be formed by spin-coating a fluid material over the substrate, such as Spin On Glass (SOG, i.e., a silicon compound RnSi(OH)4-n, (R: organic molecule and additive) containing necessary components for silicon oxide formation), using a spinner or the like, and annealing the material in, e.g., nitrogen ambient at, e.g., 300° C. for 30 min, thereby removing components other than the material constituting the silicon oxide film.

After that, contact holes 121 and 221 are formed in the silicon oxide film 32 by using, e.g., lithography and RIE. The contact hole 121 reaches the NiSi film 115b on the p-MOSFET source/drain, and the contact hole 221 reaches the NiSi film 215a on the n-MOSFET source/drain. In a preferable embodiment, the RIE is performed in two stages. First, the oxide film 32 is etched away selectively down to the silicon nitride film 31 using the liner layer as an etching stopper. Subsequently, the thin silicon nitride liner layer 31 remaining at the bottoms of the contact holes is removed by short-time etching. Since this liner-etching can be completed within a short time, the plasma damage to the underlying NiSi region can be minimized. Furthermore, even if the contact holes come to fall partially on the device isolation regions, deep erosion of the insulators in the device isolation regions (which will definitely cause device failure) can be easily prevented.

Then, the NiSi regions 115 and 215 at the bottoms of the contact holes are exposed to a plasma containing, e.g., $NF_3$ for a short period of time to clean up the NiSi surface. Subsequently, metallic material films 33, i.e., 122 and 222 having barrier properties, e.g., Ti films, are formed to have a thickness of, e.g., 5 nm on the interior surface of the contact holes by sputtering or the like.

After that, annealing is performed in nitrogen ambient at, e.g., 500° C. in order to improve the electrical contacts between the metal films 33 and the NiSi regions 115 and 215. During this annealing, Ti reduces and breaks off a thin oxide which is inevitably formed on the NiSi regions 115 and 215, thereby assuring good electrical contacts. Generally, such annealing at about 500° C. is necessary to establish a good electrical contact between NiSi formed on very small source/drain regions and an electrical interconnection material, through an even smaller contact holes. If the temperature is below 50° C., it is no longer possible to break away a thin insulating substance resulting from inevitable surface oxidation of NiSi surface. Without thermal stabilization disclosed in the present embodiment, the annealing temperature must be restricted to a lower temperature in order to avoid devastating Ni infiltration into the Si substrate. As a result, the contact resistance between the source and drain rises and the yield of the electrical interconnection decreases. Therefore, the advantage of forming a silicide layer completely disappears without thermal stabilization of the silicide layer.

Then, the contact holes 121 and 221 are filled with, e.g., W films 34, i.e., 123 and 223 by CVD using $WF_6$ and $H_2$ as supply gases. At this stage, the surfaces of the metal films 122 and 222 have already changed into a sufficiently dense structure by annealing at 500° C. After that, a silicon oxide film 35 as an interlayer dielectric film is further deposited, and trenches for embedding an interconnection material are formed in the silicon oxide film 35 by using a well-known method such as RIE. These trenches are filled with a metal material, e.g., Cu films 125 and 225 (a damascene method). Subsequently, an insulating material, e.g., a silicon nitride film 37 is further deposited to cover the upper surface of the interconnection material. In this way, the structure shown in FIG. 11 is obtained.

After that, the semiconductor device is completed by constructing multi-layered interconnections and performing a packaging step and the like if necessary.

The present embodiment explained above realizes a high-speed, low-power C-MOSFET device with the following effects.

(1) The mobilities of both types of MOSFETs can be simultaneously maximized by forming channel surfaces on crystal planes optimum for respective polarities. At the same time, although source/drain diffusion regions are very shallow, F atoms introduced into Si(100) source/drain regions for forming an n-MOSFET on a DSB substrate before silicidation and N atoms introduced into Si(110) source/drain regions for forming a p-MOSFET on the DSB substrate before silicidation suppress the diffusion of metal atoms and prevent the resultant leakage generation.

(2) At the same time, F atoms introduced into the DSB bonding plane makes it possible to hinder formation and propagation of secondary defects from the crystal defects on the bonding plane, and detrimental trapping of contaminating impurities by the crystal defects, which could lead to an increase of their electrical activities, is also avoided.

(3) The improved thermal stability of NiSi allows annealing at 500° C., so a dense silicon nitride film suitable for a barrier layer and etching stop layer can be formed.

(4) Since the improved thermal stability of NiSi allows annealing at 500° C., a good electrical contact with an interconnection metal is secured.

(5) In the formation of a DSB substrate, the surface crystal orientation is converted by amorphousization/recrystallization of prospective p-MOSFET regions, which are smaller in number and area compared to prospective n-MOSFET regions. Thus, the probability of a fatal crystal defect to emerge decreases and the fabrication yield, when compared to a case in which the same process is performed in prospective n-MOSFET regions, increases.

Note that the above embodiment has explained with a pair of C-MOSFETs as an example, but it is of course also possible to apply the above method to a plurality of pairs of devices, and selectively apply the method to devices forming a part of a semiconductor circuit. Although only a part of the upper portion of the gate electrode is silicidized in the above embodiment, the present invention is similarly applicable to silicidation of entire gate electrode (a fully-silicidized gate).

Regarding the way of N introduction, this embodiment utilized N implantation during diffusion region formation or immediately before silicidation. However, it is also possible to dope the bonding substrates with N prior to the formation of a DSB substrate. Otherwise, N can be implanted during the amorphousizing step of the prospective p-MOSFET regions. N in Si is known to immobilize crystal dislocations by sticking to the defects. Accordingly, N atoms incorporated in these manners can passivate the structural crystal defects on the bonding plane of the DSB substrate or stabilize remnant lattice damage remaining after recrystallization, and also prevent the propagation of these leakage-generating crystal defects. In addition, an oxynitride film can be easily obtained by thermally oxidizing the substrates pre-doped with N.

This method is of course entirely similarly applicable to silicidation of an elevated source/drain structure using epitaxial selective growth. Furthermore, this method is effective to any silicide whose thermal stability improves by doping of F and N.

Second Embodiment

FIG. 13 is a cross-sectional view showing an outline of the arrangement of a MOS semiconductor device according to the second embodiment of the present invention. Note that the same parts as in FIG. 11 share the same reference numerals, and a detailed explanation thereof will be omitted.

The differences of this embodiment from the previous embodiment are that the device has an elevated source/drain structure which partially extends over a device isolation region and a local interconnection is made of the NiSi layer in a self-alignment manner.

A NiSi layer 61 is formed on each source/drain diffusion region. That is, a NiSi layer 161 is formed on a first source/drain diffusion region 106b, and a NiSi layer 261 is formed on a second source/drain diffusion region 206a. In addition, a NiSi layer 61 is formed on a first source/drain diffusion region 106a and second source/drain diffusion region 206b. The NiSi layer 61 extends onto a device isolation insulating film 13 and electrically connects the regions 106b and 206a.

Fabrication steps of this embodiment will be explained below with reference to FIGS. 14A to 14E.

First, the structure shown in FIG. 12E is constructed following the steps explained in the first embodiment. However, the depth of source/drain diffusion regions 106 and 206 is adjusted to be 30 nm.

Then, as shown in FIG. 14A, an N-containing amorphous Si layer 40 having a film thickness of, e.g., 20 nm is deposited on the entire surface by using an effective method of the well-known techniques, e.g., CVD. The Si layer 40 can be easily deposited by mixing $NH_3$ in $SiH_4$ gas at, e.g., 0.2 Torr and 400° C. Furthermore, unnecessary portions of the N-containing amorphous Si layer 40 are removed by, e.g., lithography and RIE, except for portions 401 and 403 to be used as elevated source/drain regions extending over device isolation regions, a portion 402 to be used as a local interconnection between MOSFETs, and the like.

The concentration of N contained in the amorphous Si layer 40 is desirably adjusted to be in a range between $5\times10^{19}$ and $2.5\times10^{20}$ cm$^{-3}$, which is equivalent to the concentration obtained when N is implanted at a dose of $1\times10^{14}$ to $5\times10^{14}$ cm$^{-2}$ into the amorphous Si layer 40. The N doping without using ion implantation avoids crystal damages to the substrate and also is free from the channeling phenomenon which can occur during ion implantation on Si(110) plane, resulting in deeper-than-expected N introduction. Of course, N implantation after formation of the amorphous Si layer 40 can be utilized. Since N in Si immobilizes crystal dislocations, N atoms incorporated into the additionally formed Si layer 40 can passivate structural crystal defects which can be formed at the interface with the underlying DSB substrate, and prevent the propagation of these leakage-generating crystal defects to the lower portion of the DSB substrate, thereby reducing leakage generation.

In addition, unlike the epitaxial growth method, CVD can deposit the Si film very uniformly. Therefore, undesirable nonuniformity in the film thickness as well as inconsistent film quality of the additional Si layer, which are otherwise expected due to the difference in crystallinity of the DSB substrate, can be avoided. As a result, sporadic protrusion of silicide layers induced by the nonuniformity in thickness and inconsistency in quality of the Si film is prevented during ensuing silicidation, leading to a stable silicide layer formation. Furthermore, extension of the source and drain electrodes over the device isolation regions reduces the capacitive coupling with the substrate, thereby enabling a high-speed operation of the MOSFETs.

As a next step, the obtained substrate is exposed to a carbon-containing plasma. This carbon-containing plasma can be generated by an effective method within the range of the well-known techniques. For example, the carbon-containing plasma can be generated by supplying a gas such as $CF_4$, $CHF_3$, CCl, or $CH_4$ into a plasma. If the substrate has a carbon-containing material such as a photoresist mask, carbon can be supplied from this material with the help of ion bombardment from plasma.

Generally, plasma has a positive potential with respect to the surrounding materials in order to maintain the plasma state. Consequently, the plasma develops electric fields normal to the surrounding materials, so that positively charged particles in the plasma impinge perpendicularly on the surrounding materials. Of course, positively charged carbon particles in the plasma perpendicularly collide against the Si layer 40. The normal incidence of the carbon particles creates carbon-containing Si layers selectively on the horizontal surfaces but not on vertical surfaces of the Si layer 40. Usually, bombarding particles from plasma are accelerated by plasma voltage of less than 1 kV, therefore, the thickness of this carbon-containing Si layer is at most a few nm. And, the carbon concentration more than 1 atomic % is enough for the following application.

Subsequent thermal oxidation of the carbon-containing Si layer forms a HF-solution-resistant oxide film as disclosed in U.S. Pat. No. 6,271,566B1 (M. Tsuchiaki, Toshiba). On the other hand, an ordinary oxide film is formed on the vertical portions of the Si layer 40. Therefore, by dipping the substrate in an HF solution after the thermal oxidation, the ordinary oxide films on the vertical surfaces of the Si layer 40 can be selectively removed while the HF-solution-resistant oxide films are left behind on the horizontal surfaces of the Si layer 40. During the oxidation, the Si layer 40 crystallizes in reference to the crystallinity of the underlying substrate. That is, amorphous Si in contact with Si(100) changes to a crystal having Si(100) surface plane, and amorphous Si in contact with Si(110) changes to a crystal having Si(110) surface plane. Furthermore, the vertical portions of the Si layer 40 exposed by the HF dipping can be selectively removed by an isotropic Si etching having selectivity to an oxide film, e.g., an etching step such as CDE, by using the HF-solution-resistant oxide film on the horizontal surfaces as a mask.

Then, the oxide film remaining on the horizontal surfaces of the Si layer 40 is removed by, e.g., RIE. Thus, additional source/drain-Si layers 141, i.e., 141*a* and 141*b* and 241, i.e., 241*a* and 241*b* which partially extend over the device isolation regions, and additional Si layers 142 and 242 on gate electrodes 103 and 203 are formed. The source/drain-Si layers 141*a* and 241*b* will be used for forming local interconnections between MOSFETs. FIG. 14B shows the cross-sectional view at this stage. Here, it should be noted that, for a silicide layer, which will be formed on the upper surfaces of these additional Si layers, the effective junction depth becomes 50 nm=20 nm+30 nm (i.e., increased by the exact amount of the additional Si layer's thickness).

Then, as shown in FIG. 14C, a photoresist 51 is formed on a prospective p-MOSFET region 100, as a mask to exclusively ion-implant $1\times10^{14}$ cm$^{-2}$ of F atoms on a prospective n-MOSFET region 200 at an acceleration energy of 2 keV. Consequently, F-containing regions 251*a*, 251*b*, and 252 about 10 nm thick are respectively formed on the additional source/drain-Si layer 241*a*, which partially extends over the device isolation region, the Si layer 241*b* for a local interconnection, and the additional Si layer 242 on the gate electrode 203.

As described previously, if F ions are implanted from the normal direction, some F ions may reach the bonding plane by the channeling effect. Many crystal defects such as dislocations and dangling bonds are formed at the bonding plane just below the substrate surface in the region 200. F atoms tend to combine with defect-forming unstable Si atoms, thereby physically stabilizing and electrically inactivating the crystal defects. Formation and propagation of secondary defects from the crystal defects at the bonding plane can be prevented. Detrimental trapping of contaminating impurities by the crystal defects, which could increase their electrical activities, is also obstructed.

Furthermore, since F implantation to the Si(100) plane produces no specific leakage-generating defects unlike the implantation to Si(110) plane, the selective introduction of F atoms on the second region 200 can effectively suppress leakage generation from p-n junctions of source/drain regions even they are located very close to the bonding plane.

Of course, the F atoms to be incorporated into a NiSi film during ensuing silicidation will drastically improve the thermal stability of the resulting NiSi. Thus, even with an annealing at 500° C., a significant leakage reduction by about six orders of magnitude will be achieved when compared to a case in which no F is implanted.

In addition, F implantation on the first region 100 needs to be avoided to prevent formation of unnecessary leakage-generating defects indigenous to F implantation on Si(110), which could otherwise spoil the benefit of N and even accelerate Ni infiltration.

Moreover, the additional source/drain-Si layers 141*b* and 241*a* partially extending over the device isolation regions and the Si layers 141*a* and 241*b* for local interconnections protect the oxide films in the device isolation regions adjacent to the diffusion regions 106 and 206 and prevent their erosive receding by HF etching or the like. If the device isolation films around the diffusion regions recede, the effective junction depth at the peripheries of the diffusion regions becomes shallower, and this readily induces junction leakage. The additional Si layer 40 to protect the device isolation oxide adjacent to the diffusion regions not only prevents the junction from practically becoming shallow as described above, but also reliably increases the junction depth by the exact amount of the added Si layer 40.

Next, a Ni film having a film thickness of, e.g., 12 nm is deposited on the entire surface by using an effective method of the well-known techniques, e.g., sputtering. On this Ni film, a capping layer such as Ti or TiN could be deposited if necessary. Subsequent rapid thermal annealing (RTA) in nitrogen at, e.g., 450° C. for 30 sec, promotes selectively silicidation reaction between Ni and Si where they are in direct contact. Unreacted Ni is then removed by dipping the substrate in a mixed solution of sulfuric acid and hydrogen peroxide.

Consequently, as shown in FIG. 14D, NiSi films 161, 261, and 61 are formed on the additional source/drain-Si layers 141*b* and 241*a* which partially extend over device isolation regions, and on the Si layers 141*a* and 241*b* forming local interconnections between MOSFETs. Also, NiSi films 162 and 262 are formed on the p-MOSFET gate electrode 103 and n-MOSFET gate electrode 203. The film thickness of NiSi is about 28 nm. Note that all the additional Si layers are silicided in FIG. 14D.

During this silicidation, a portion of N atoms in the N-containing regions (i.e., in the source/drain-Si layers 141*b* and 241*a* and Si layers 141*a* and 241*b* for local interconnections) is incorporated into the resulting NiSi film and also at the NiSi/Si interface. In the present case, the areal density of N in the NiSi film is $8.5\times10^{13}$ cm$^{-2}$, the peak N concentration in the NiSi film is $5.0\times10^{19}$ cm$^{-3}$, and the concentration of N at the NiSi/Si interface is $1.0\times10^{19}$ cm$^{-3}$. Thanks to the improved thermal stability by the N incorporation, NiSi on Si(110) withstands an annealing at 500° C. without leakage generation. For example, if the depth of the diffusion layers 106 is 30 nm, the junction depth from the bottom of the silicide layer is about 26 nm, so the present NiSi layer can endure an annealing at 500° C. for up to 30 min in accordance with approximate expression (A).

On the other hand, a portion of F atoms in the F-containing regions 251 and 252 on the prospective n-MOSFET region 200 is incorporated in the NiSi film and also at the NiSi/Si interface during the silicidation. In the present case, the areal F density in the NiSi film is $5.0 \times 10^{13}$ cm$^{-2}$, and the maximum F concentration at the NiSi/Si interface is $6.0 \times 10^{19}$ cm$^{-3}$. Thanks to the improved thermal stability by the F incorporation, NiSi on Si(100) withstands an annealing at 500° C. The leakage current can be reduced by about six orders of magnitude when compared to a case without F implantation.

Regarding to the N doping of the n-MOSFET region 200, it alone cannot improve the thermal stability of NiSi on Si(100) single-handedly, but neither cause any adverse side effects such as leakage generation observed for F implantation on Si(110). Therefore, in terms of the leakage generation near the surface, the impacts of N doping would be neutral. However, for the benefit of high-yield device fabrication, it will immobilize the structural defects at the interface between the additionally formed Si layers and the DSB substrate below them and prevent the propagation of these leakage-generating defects to the lower portion of the DSB substrate.

It should be also mentioned here that the NiSi layers 162 and 262 formed on the gate electrodes 103 and 203 contain no conductive impurity regardless of the polarity of the MOSFET. The resistivity of NiSi obtained by silicidizing a Si layer containing both n- and p-type conductive impurities tends to become higher than that of NiSi obtained by silicidizing a Si layer containing only one type of these conductive impurities. In the conventional C-MOS formation method, a portion of a gate poly-Si electrode which connects a p-MOSFET and n-MOSFET would be doped with both conductive impurities. However, the present embodiment silicidizes the Si layers 142 and 242 containing only N and F on the gate poly-Si electrodes. Therefore, the rise NiSi's resistivity caused by co-existence of both n- and p-type conductive impurities can be avoided, thereby efficiently reducing the electrical resistance of the narrow gate electrode which connects the p-MOSFET and n-MOSFET.

It is also worth to be mentioned here that the local interconnections are completed simultaneously with the silicidation and the device fabrication process is greatly simplified.

Then, as shown in FIG. 14E, a silicon nitride film 31 having a thickness of, e.g., 20 nm is deposited conformaly on the exterior surface of the above structure so as to cover the NiSi regions 161, 162, 261, 262, and 61. CVD using $Si_2Cl_6$ and $NH_3$ as supply gases or Atomic Layer Deposition (ALD) using $SiH_2Cl_4$ and $NH_3$ can achieve this uniform and conformal deposition of the silicon nitride film at a low temperature. This silicon nitride film 31 serves as a barrier layer and also functions as an etching stop layer, i.e., as a liner layer during ensuing contact-hole formation process through an interlayer dielectric film. When the liner layer is formed evenly on the exterior surface of the substrate including the device isolation regions, contact holes can be formed without precisely aligning them to respective NiSi regions (borderless contact formation). This simplifies the device fabrication process and reduces the fabrication cost. In the present embodiment, annealing at 500° C., which would otherwise generate substantial leakage, is allowed because of improved thermal stability by N and F. Thus, a dense silicon nitride film with a refractive index of 1.89 or more, which is very suitable for a liner layer, becomes available.

Subsequently, as in the first embodiment, a silicon oxide film 32 is deposited as an interlayer dielectric film on the silicon nitride liner layer 31. A silicon oxide film having a planar upper surface can be formed at a low temperature by supplying $O_3$ and $Si(OC_2H_5)_4$ (TEOS) gases at, e.g., 400° C. The silicon oxide film 32 can otherwise be formed by spin-coating a fluid material over the substrate, such as Spin On Glass (SOG, i.e., a silicon compound RnSi(OH)4-n, (R: organic molecule and additive) containing necessary components for silicon oxide formation), using a spinner or the like, and annealing the material in, e.g., nitrogen ambient at, e.g., 300° C. for 30 min, thereby removing components other than the material constituting the silicon oxide film.

After that, contact holes 121 and 221 are formed in the silicon oxide film 32 in the same manner as in the first embodiment. The contact hole 121 reaches the NiSi region 161 on the p-MOSFET source/drain, and the contact hole 221 reaches the NiSi region 261 on the n-MOSFET source/drain. In a preferable embodiment, the RIE is performed in two steps. First, the oxide film 32 is etched away selectively down to the silicon nitride film 31 using the liner layer as an etching stopper. Subsequently, the thin silicon nitride liner layer 31 remaining at the bottoms of the contact holes is removed by short-time etching. Since this liner-etching can be completed within a short time, the plasma damage to the underlying NiSi region can be minimized. Furthermore, even if the contact holes come to fall partially on the device isolation regions, deep erosion of the insulators in the device isolation regions, which will definitely cause device failure, can be easily prevented.

Then, the NiSi regions 161 and 261 at the bottoms of the contact holes are exposed to a plasma containing, e.g., $NF_3$ for a short period of time to clean up the NiSi surface. Subsequently, metallic material films 33, i.e., 122 and 222 having barrier properties, e.g., Ti films, are formed to have a thickness of, e.g., 5 nm on the interior surface of the contact holes by sputtering or the like.

After that, annealing is performed in nitrogen ambient at, e.g., 500° C. in order to improve the electrical contacts between the metal films 33 and the NiSi regions 161 and 261. This annealing removes a thin oxide formed on the NiSi regions 161 and 261, thereby assuring a good electrical contact.

Then, the contact holes 121 and 221 are filled with, e.g., W films 34, i.e., 123 and 223 by CVD using $WF_6$ and $H_2$ as supply gases. At this stage, the surfaces of the metal material films 122 and 222 have already turned into a sufficiently dense structure by annealing at 500° C. After that, a silicon oxide film 35 as an interlayer dielectric film is further deposited, and trenches for burying an interconnection material are formed in the silicon oxide film 35 by using a well-known method such as CVD or RIE. These trenches are filled with a metal material, e.g., Cu films 125 and 225 (a damascene method). Subsequently, an insulating material, e.g., a silicon nitride film 37 is further deposited to cover the upper surface of the interconnection material. In this manner, the structure shown in FIG. 13 is obtained.

After that, the semiconductor device is completed by constructing multi-layered interconnections and performing a packaging step and the like if necessary.

As described above, the present embodiment not only enjoys the effects (1) to (5) of the first embodiment but also provides the following benefits in addition to them.

(6) Since the additional Si film is deposited by CVD, undesirable nonuniformity in the film thickness as well as inconsistency in film quality of the Si layer due to the difference in crystallinity of the DSB substrate can be avoided unlike the epitaxial growth method. Thus, stable layer formation is made available during ensuing silicidation without sporadic protrusion of the silicide layers, which would otherwise be induced by the variation in thickness and quality of the Si film.

(7) Since N in Si immobilizes crystal dislocations, N atoms incorporated into the additionally formed Si layer can passivate structural crystal defects at the interface between the additionally formed S and the underlying DSB substrate, and prevent the propagation of these leakage-generating crystal defects to the lower portion of the DSB substrate, thereby reducing leakage generation.

(8) Since N is doped without using ion implantation, no damage is inflicted on the substrate crystal by ion implantation. It is also possible to avoid channeling phenomenon, which can occur during ion implantation on Si(110) plane, thereby preventing deeper-than-expected N introduction.

(9) Since the source and drain electrodes partially extend over the device isolation regions, capacitive coupling to the substrate is reduced, thereby enabling a high-speed operation of the MOSFETs.

(10) Since NiSi layers on the gate electrodes are obtained by silicidizing Si layers containing no conductive impurity, it is possible to avoid the rise in resistivity caused by co-existence of both n- and p-type conductive impurities, thereby efficiently reducing the electrical resistance of the narrow gate electrode which connects the p-MOSFET and n-MOSFET.

(11) Since the additional source/drain Si layers and the Si layers for local interconnections protect the oxide films in the device isolation regions adjacent to the diffusion regions, erosive receding of the device isolation insulators at the peripheries of the diffusion regions by HF etching or the like can be prevented, thereby reliably increasing the effective junction depth by the exact amount of the added Si layer thickness.

(12) Since local interconnections are completed simultaneously with silicidation, the device fabrication process is simplified.

Note that the above embodiment has explained with a pair of complementary MOSFETs as an example, but it is of course also possible to apply the above method to a plurality of pairs of devices, and selectively apply the method to devices forming a part of a semiconductor circuit. Note also that the above embodiment silicidizes only a part of the upper portion of the gate electrode, but the present invention is similarly applicable to silicidation of entire gate electrode (a fully-silicidized gate).

Additionally, this method is effective to any silicide whose thermal stability improves by doping of F and N. For example, the method can also be applied to a silicide using Co or Ti instead of Ni.

Furthermore, the MOSFET structure is not necessarily limited to FIG. 11 or 13, and can be appropriately changed in accordance with the specifications. Although each embodiment has explained with an example in which gate sidewall insulating films and source/drain extension regions are formed, the present invention can also be applied to a structure from which these elements are omitted.

The present invention is further applicable to a MOSFET (a so-called MISFET) using an insulating film other than an oxide film as a gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS semiconductor device comprising:
1) a substrate having a major area comprising a first region and a second region, Si surface of the first region being aligned to a {110} plane, and Si surface of the second region being aligned to a {100} plane;
2) a p channel MOSFET comprising:
a first gate electrode insulatively disposed over the first region;
first source/drain regions formed in the first region with the first gate electrode arranged between the first source/drain regions, the first source/drain regions including a surface region having extrinsic impurities consisting of N atoms; and
a first silicide layer formed on the first source/drain regions, and containing N atoms at an areal density of $8.5 \times 10^{13}$ to $8.5 \times 10^{14}$ cm$^{-2}$; and
3) an n channel MOSFET comprising:
a second gate electrode insulatively disposed over the second region;
second source/drain regions formed in the second region, with the second gate electrode arranged between the second source/drain regions, the second source/drain regions including a surface region having extrinsic impurities consisting of F atoms; and
4) a second silicide layer formed on the second source/drain regions, and containing F atoms at an areal density of not less than $5.0 \times 10^{13}$ cm$^{-2}$.

2. A device according to claim 1, wherein both the first silicide layer and the second suicide layer are made of NiSi.

3. A device according to claim 1, wherein a single crystal Si layer having a Si {110} surface is directly bonded to a lower Si substrate in the first region.

4. A device according to claim 1, wherein a depth of the first source/drain regions from a lower surface of the first silicide layer into the substrate is 20 to 30 nm (both inclusive), and a leakage current density is not more than $1.0 \times 10^{-6}$ A/cm$^2$.

5. A device according to claim 1, wherein a stack of insulating layers composed of a lower silicon nitride film whose optical refractive index is not less than 1.89 and a upper silicon oxide film thereon are formed on the first silicide layer and the second silicide layer, and contact holes reaching the first silicide layer and the second silicide layer are formed through the insulating layers and filled with a metal material.

6. A device according to claim 1, wherein portions of the first silicide layer and the second silicide layer extend over an insulator material in a device isolation region which surrounds the first region and the second region and electrically isolates each other.

7. A device according to claim 1, wherein the first silicide layer on one of the first source/drain regions and the second silicide layer on one of the second source/drain regions are physically and electrically connected.

8. A device according to claim 1, wherein a suicide layer similar to the first suicide layer is formed on the first gate electrode, and a silicide layer similar to the second suicide layer is formed on the second gate electrode.

9. A device according to claim 1, wherein the first gate electrode is made of a silicide similar to the first suicide layer, and the second gate electrode is made of a silicide similar to the second suicide layer.

10. A device according to claim 1, wherein the substrate below the second silicide layer contains F atoms at an areal density of not less than $5.0 \times 10^{13}$ cm$^{-2}$.

11. A MOS semiconductor device comprising:

1) a substrate having a major area comprising a first region and a second region, Si surface of the first region being aligned to a {110} plane, and Si surface of the second region being aligned to a {100} plane;
2) a p channel MOSFET comprising:
    a first gate electrode insulatively disposed over the first region;
    first source/drain regions formed in the first region with the first gate electrode arranged between the first source/drain regions, the first source/drain regions including a surface region including N atoms with no implanted C atoms; and
    a first silicide layer formed on the first source/drain regions, and containing N atoms at an areal density of $8.5 \times 10^{13}$ to $8.5 \times 10^{14}$ cm$^{-2}$; and
3) an n channel MOSFET comprising:
    a second gate electrode insulatively disposed over the second region;
    second source/drain regions formed in the second region, with the second gate electrode arranged between the second source/drain regions, the second source/drain regions including a surface region including F atoms; and
4) a second suicide layer formed on the second source/drain regions, and containing F atoms at an areal density of not less than $5.0 \times 10^{13}$ cm$^{-2}$.

* * * * *